United States Patent
Marshall et al.

(10) Patent No.: US 12,446,142 B2
(45) Date of Patent: Oct. 14, 2025

(54) MATERIALS AND CONFIGURATIONS FOR PROTECTION OF OBJECTIVE MATERIALS

(71) Applicant: TAE TECHNOLOGIES, INC., Foothill Ranch, CA (US)

(72) Inventors: Daniel Marshall, Chandler, AZ (US); Anatoly Muchnikov, Mission Viejo, CA (US); Sergey Vdovichev, Foothill Ranch, CA (US)

(73) Assignee: TAE Technologies, Inc., Foothill Ranch, CA (US)

( * ) Notice: Subject to any disclaimer, the term of this patent is extended or adjusted under 35 U.S.C. 154(b) by 0 days.

(21) Appl. No.: 17/711,298

(22) Filed: Apr. 1, 2022

(65) Prior Publication Data
US 2023/0009459 A1 Jan. 12, 2023

Related U.S. Application Data

(60) Provisional application No. 63/170,108, filed on Apr. 2, 2021.

(51) Int. Cl.
*H05H 6/00* (2006.01)
*H05H 3/06* (2006.01)

(52) U.S. Cl.
CPC ............ *H05H 6/00* (2013.01); *H05H 3/06* (2013.01)

(58) Field of Classification Search
CPC .............. H05H 6/00; H05H 3/06; G21G 4/02
See application file for complete search history.

(56) References Cited

U.S. PATENT DOCUMENTS

| | | | |
|---|---|---|---|
| 3,640,597 A * | 2/1972 | Noble | H05H 6/00 376/151 |
| 2006/0011866 A1 | 1/2006 | Cho | |
| 2006/0140326 A1* | 6/2006 | Rowland | H05H 3/06 376/114 |
| 2013/0064338 A1* | 3/2013 | Matsumoto | H05H 6/00 376/108 |
| 2015/0216029 A1* | 7/2015 | Tsuchida | B23K 20/021 376/151 |
| 2016/0270202 A1* | 9/2016 | Shioda | A61N 5/10 |

(Continued)

FOREIGN PATENT DOCUMENTS

| | | | | |
|---|---|---|---|---|
| EP | 3761321 A2 * | 1/2021 | | G21G 1/04 |
| JP | 59-171181 | 6/1986 | | |

(Continued)

OTHER PUBLICATIONS

Vanleeuw, D., Sapundjiev, D., Sibbens, G. et al. Physical vapour deposition of metallic lithium. J Radioanal Nucl Chem 299, 1113-1120 (2014). https://doi.org/10.1007/s10967-013-2669-6 (Year: 2014).*

(Continued)

*Primary Examiner* — Sharon M Davis
(74) *Attorney, Agent, or Firm* — ALSTON & BIRD LLP

(57) ABSTRACT

Passivation regions and device configurations are described herein. The passivation regions can be configured to seal against diffusion of an objective material from an underlying region into and/or through the passivation region. The passivation regions can also be configured to seal against diffusion of an externally sourced or ambient substance into and/or through the passivation region towards the underlying region.

23 Claims, 10 Drawing Sheets

(56) References Cited

U.S. PATENT DOCUMENTS

| | | | |
|---|---|---|---|
| 2017/0062086 A1* | 3/2017 | Park, Jr. ................... | G21G 4/02 |
| 2019/0122780 A1* | 4/2019 | Murakami ............... | G21G 4/02 |
| 2019/0262632 A1* | 8/2019 | Liu .......................... | H05H 3/06 |
| 2021/0076481 A1 | 3/2021 | Jauregui et al. | |

FOREIGN PATENT DOCUMENTS

| | | |
|---|---|---|
| JP | S61-085100 U | 6/1986 |
| JP | 2009-32623 | 2/2009 |
| JP | 2010-509714 | 3/2010 |
| JP | 2015-217207 | 12/2015 |
| WO | WO-2019029483 A1 * | 2/2019 |

OTHER PUBLICATIONS

Espacenet translation of WO2019029483 (Year: 2019).*
Espacenet translation of EP 3761321 (Year: 2021).*
PCT/US2022/023018 International Search Report and Written Opinion mailed Jul. 26, 2022.
Marks, "Accelerator Magnets," Room Temperature Magnets, CAS Praque 2014, (Jul. 2014).
Taskaev et al., "Vacuum-Insulation Tandem Accelerator for oron Neutron Capture Theraply," Proceedings of IPAC2011, Switzerland, CERN, Sep. 2011, p. 3615-3617.

* cited by examiner

AIR (1 min)

AIR (3 min)

AIR (125 min)

MATERIALS AND CONFIGURATIONS FOR PROTECTION OF OBJECTIVE MATERIALS

CROSS-REFERENCE TO RELATED APPLICATIONS

The present application claims priority to U.S. Provisional Application Ser. No. 63/170,108, titled "MATERIALS AND CONFIGURATIONS FOR PROTECTION OF OBJECTIVE MATERIALS," filed Apr. 2, 2021, the contents of which are incorporated herein by reference in their entirety for all purposes.

FIELD

The subject matter described herein relates generally to protection or passivation of an objective material, for example, the passivation of a lithium layer within a neutron generation device.

BACKGROUND

Numerous applications exist where it is desirable to protect or passivate a material within a device. One such application is boron neutron capture therapy (BNCT), which represents a relatively new modality of treatment of a variety of types of cancer, including the most difficult types. BNCT is a technique that selectively aims to treat tumor cells while sparing the normal cells using a boron compound. A substance that contains boron is injected into a blood vessel, and the boron collects in tumor cells. The patient then receives radiation in the form of a neutron beam. The neutrons are produced by interaction of a proton beam with a neutron generation material, such as lithium or beryllium, that is positioned on a target substrate. The resulting neutron beam is moderated and focused on the patient, where the neutrons react with the boron to selectively kill the tumor cells.

The neutron generation material can be positioned as a layer, covering, or coating that can interact with certain types of particles or plasmas. Lithium is a conventional example, but it is a highly-reactive and corrosive metal that is difficult to handle in normal ambient conditions (e.g., air at room temperature such as found in general lab space, and the like). Lithium violently reacts with moisture, nitrogen and/or oxygen in atmospheric air and tarnishes and/or oxidizes rapidly. The lithium turns into nitride and hydroxide (e.g., lithium hydroxide (LiOH and LiOH—$H_2O$), lithium nitride ($Li_3N$), and lithium carbonate ($Li_2CO_3$, a result of a secondary reaction between LiOH and $CO_2$)), which can delaminate from the substrate in the form of a dust. The air and moisture act as a catalyst for such reaction.

For safe handling, in one example the lithium may be attached to a substrate inside of a glovebox, and filled with inert pure gas (e.g., argon). Transfer of the lithium from a glovebox to a working area requires the use of a "dry room," where the amount of moisture in the air is low enough to prevent the lithium from oxidizing or tarnishing too significantly. However, humans working in the dry rooms introduce moisture naturally, eliminating benefits afforded by the dry room. Further, construction of dry rooms is complicated and expensive.

Attempts at addressing the above drawbacks have been met with limited or no success, depending on the particular application for which the lithium is used. Synthesis of $Li_3N$ on a surface of a lithium target has been proposed. Disadvantages of such an approach include an inability to control thickness of the $Li_3N$ layer and a high diffusion coefficient of lithium in $Li_3N$. Moreover, such an approach does not eliminate the risk of contamination or oxidation, even at ultra-high vacuum (UHV) conditions.

A thick layer of lithium covered or protected by a thin layer of stainless steel (SS) has also been proposed as a solution. Such an approach suffers from a limited time interval during which the lithium is protected and viable (e.g., only 10 minutes). Moreover, approaches associated with thick coatings applied on top of accelerator target materials result in a slow-down of accelerator particles and thus a lower yield or prevention entirely of the desired reaction.

An oxidation resistant layer of beryllium (Be) and/or aluminum (Al) has also been proposed. Drawbacks associated with such approaches include the high reactivity between lithium and aluminum when the two are in contact, and the quick diffusion of aluminum through the lithium. Further, beryllium is hazardous and difficult to work with.

For these and other reasons, needs exist for improved systems, devices, and methods that facilitate passivation of materials.

SUMMARY

Example embodiments of systems, devices, and methods are described herein for protection or passivation of an objective material. A passivation region can be configured to seal against diffusion of the objective material from an underlying region into and/or through the passivation region. The passivation region can also be configured to seal against diffusion of an externally sourced or ambient substance into and/or through the passivation region towards the underlying region. Passivation regions having single and multi-layer configurations are described. Example embodiments are described in the context of neutron generation applications where the objective material is lithium.

Other systems, devices, methods, features, and advantages of the subject matter described herein will be or will become apparent to one with skill in the art upon examination of the following figures and detailed description. It is intended that all such additional systems, methods, features and advantages be included within this description, be within the scope of the subject matter described herein, and be protected by the accompanying claims. In no way should the features of the example embodiments be construed as limiting the appended claims, absent express recitation of those features in the claims.

BRIEF DESCRIPTION OF FIGURES

The details of the subject matter set forth herein, both as to its structure and operation, may be apparent by study of the accompanying figures, in which like reference numerals refer to like parts. The components in the figures are not necessarily to scale, emphasis instead being placed upon illustrating the principles of the subject matter. Moreover, all illustrations are intended to convey concepts, where relative sizes, shapes and other detailed attributes may be illustrated schematically rather than literally or precisely.

DETAILED DESCRIPTION

Before the present subject matter is described in detail, it is understood that this disclosure is not limited to the particular embodiments described, as such may, of course, vary. It is also to be understood that the terminology used herein is for the purpose of describing particular embodiments only, and is not intended to be limiting, since the scope of the present disclosure will be limited only by the appended claims.

Neutron generation targets and other high energy devices or structures often have corrodible and/or mobile chemical constituents like lithium. Example embodiments of systems, devices, and methods are described herein for passivation or protection of these corrodible and/or mobile materials. For ease of discussion, the material for which it is the object to passivate or protect may be referred to herein as the objective material. A passivation region can be configured to hold or maintain the objective material in position by inhibiting diffusion of the objective material into (and entirely through) the passivation region. The passivation region can also be configured to isolate the objective material from chemical substances in the ambient environment and thereby protect it from contaminants (e.g., air components such as nitrogen and oxygen, or water components such as hydrogen and oxygen) and other undesired corrosive reactions.

Applications within which the objective material is used can vary widely. Example embodiments of passivation are described herein for objective materials in this wide variety of applications. A non-exhaustive list of applications includes: reactors for research or energy generation and commercialization such as fusion and fission reactors; particle accelerators used for medical applications (such as medical diagnostic systems, medical imaging systems, or radiation therapy systems), for scientific tools, for industrial or manufacturing processes (such as the manufacturing of semiconductor chips), for the alteration of material properties (such as surface treatment), for the irradiation of food, or for pathogen destruction in medical sterilization; and imaging applications, such as cargo or container inspection.

For ease of description, many embodiments described herein will be done so in the context of a radiation therapy system that uses a lithium objective material as a neutron generation material in a neutron generation target configured for use in BNCT. The embodiments can be used with other neutron generation materials such as beryllium (Be). The embodiments are not limited to neutron production nor BNCT applications.

Example BNCT Applications

Figure 1A:
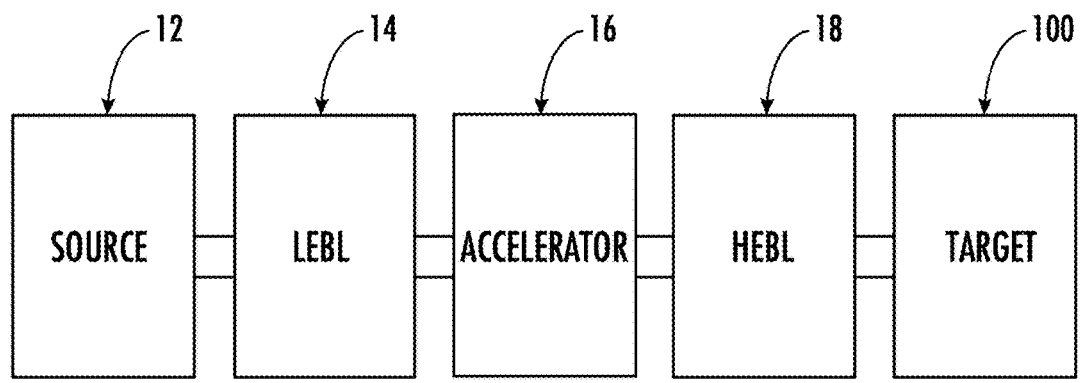
FIG. 1A is a schematic diagram of an example embodiment of a neutron beam system.

Turning in detail to the figures, FIG. 1A is a schematic diagram of an example embodiment of a beam system 10 for use with embodiments of the present disclosure. In FIG. 1A, beam system 10 includes a source 12, a low-energy beamline (LEBL) 14, an accelerator 16 coupled to the low-energy beamline (LEBL) 14, and a high-energy beamline (HEBL) 16 extending from the accelerator 16 to a target 100. LEBL 14 is configured to transport a beam from source 12 to an input of accelerator 16, which in turn is configured to produce a beam by accelerating the beam transported by LEBL 14 HEBL 18 transfers the beam from an output of accelerator 40 to target 100. Target 100 can be a structure configured to produce a desired result in response to the stimulus applied by the incident beam, or can modify the nature of the beam. Target 100 can be a component of system 10 or can be a workpiece that is conditioned or manufactured, at least in part, by system 10.

Figure 1B:
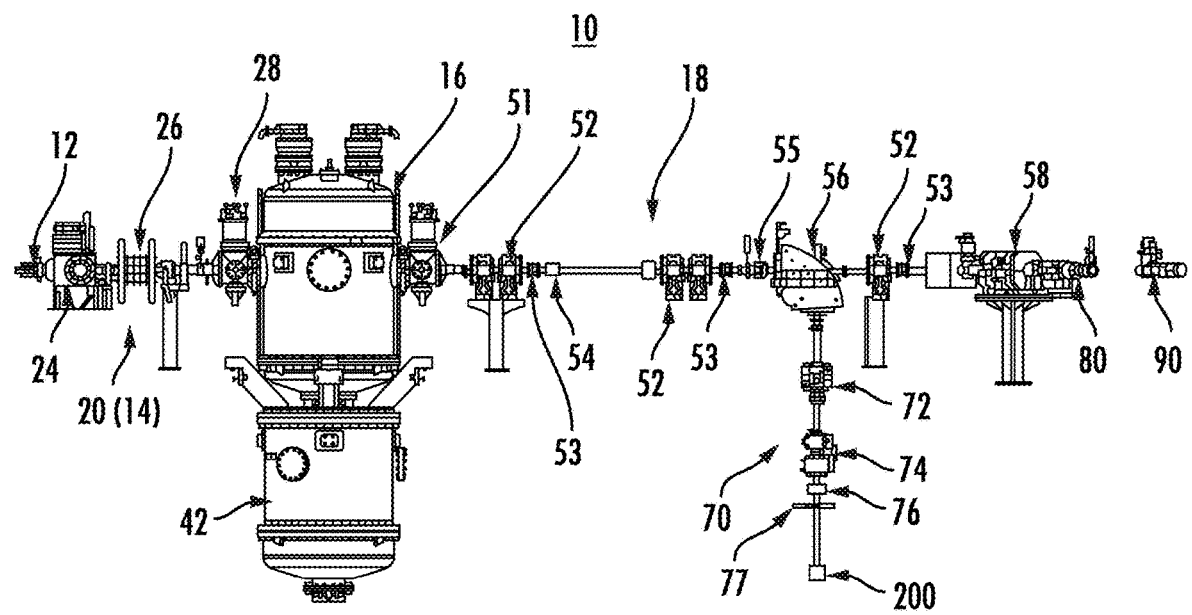
FIG. 1B is a schematic diagram of another example embodiment of a neutron beam system.

FIG. 1B is a schematic diagram illustrating another example embodiment of a neutron beam system 10 for use in boron neutron capture therapy (BNCT). Here, source 12 is an ion source and accelerator 16 is a tandem accelerator. Neutron beam system 10 includes a pre-accelerator system 20, serving as a charged particle beam injector, high voltage (HV) tandem accelerator 16 coupled to pre-accelerator system 20, and HEBL 18 extending from tandem accelerator 16 to a neutron target assembly 200 housing target 100 (not shown). In this embodiment target 100 is configured to generate neutrons in response to impact by protons of a sufficient energy, and can be referred to as a neutron generation target. Neutron beam system 10 as well as pre-accelerator system 20 can also be used for other applications such as those other examples described herein, and is not limited to BNCT.

Pre-accelerator system 20 is configured to transport the ion beam from ion source 12 to the input (e.g., an input aperture) of tandem accelerator 16, and thus also acts as LEBL 14. Tandem accelerator 16, which is powered by a high voltage power supply 42 coupled thereto, can produce a proton beam with an energy generally equal to twice the voltage applied to the accelerating electrodes positioned within accelerator 16. The energy level of the proton beam can be achieved by accelerating the beam of negative hydrogen ions from the input of accelerator 16 to the innermost high-potential electrode, stripping two electrons from each ion, and then accelerating the resulting protons downstream by the same applied voltage.

HEBL 18 can transfer the proton beam from the output of accelerator 16 to the target within neutron target assembly 200 positioned at the end of a branch 70 of the beamline extending into a patient treatment room. System 10 can be configured to direct the proton beam to any number of one or more targets and associated treatment areas. In this embodiment, the HEBL 18 includes three branches 70, 80 and 90 that can extend into three different patient treatment rooms, where each branch can terminate in a target assembly 200 and downstream beam shaping apparatus (not shown). HEBL 18 can include a pump chamber 51, quadrupole magnets 52 and 72 to prevent de-focusing of the beam, dipole or bending magnets 56 and 58 to steer the beam into treatment rooms, beam correctors 53, diagnostics such as current monitors 54 and 76, a fast beam position monitor 55 section, and a scanning magnet 74.

The design of HEBL 18 depends on the configuration of the treatment facility (e.g., a single-story configuration of a treatment facility, a two-story configuration of a treatment facility, and the like). The beam can be delivered to target assembly (e.g., positioned near a treatment room) 200 with the use of bending magnet 56. Quadrupole magnets 72 can be included to then focus the beam to a certain size at the target. Then, the beam passes one or more scanning magnets 74, which provides lateral movement of the beam onto the target surface in a desired pattern (e.g., spiral, curved, stepped in rows and columns, combinations thereof, and others). The beam lateral movement can help achieve smooth and even time-averaged distribution of the proton beam on the lithium target, preventing overheating and making the neutron generation as uniform as possible within the lithium layer.

After entering scanning magnets 74, the beam can be delivered into a current monitor 76, which measures beam current. Target assembly 200 can be physically separated from the HEBL volume with a gate valve 77. The main function of the gate valve is separation of the vacuum volume of the beamline from the target while loading the target and/or exchanging a used target for a new one. In embodiments, the beam may not be bent by 90 degrees by a bending magnet 56, it rather goes straight to the right of FIG. 1B, then enters quadrupole magnets 52, which are located in the horizontal beamline. The beam could be subsequently bent by another bending magnet 58 to a needed angle, depending on the building and room configuration. Otherwise, bending magnet 58 could be replaced with a Y-shaped magnet in order to split the beamline into two directions for two different treatment rooms located on the same floor.

Figure 2:
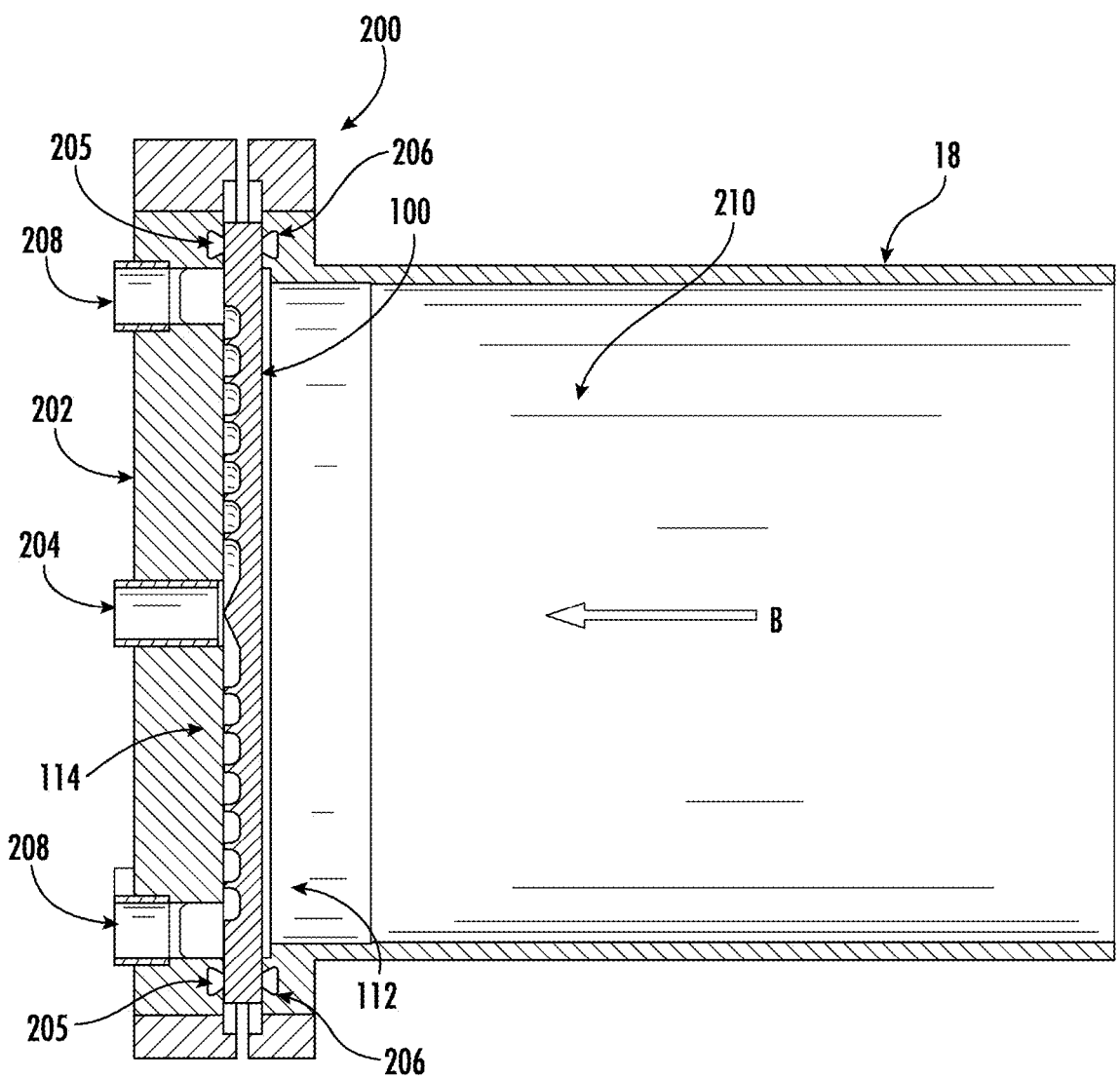
FIG. 2 is a cross-sectional view depicting an example embodiment of a target assembly subsystem.

FIG. 2 is a cross-sectional view drawing depicting an example embodiment of a target assembly subsystem 200 of the neutron beam system 10 shown in FIG. 1B. In this embodiment, neutron generation target 100 is enclosed between a cap 202 and a vacuum or near vacuum interior region 210 of HEBL 18. An arrow B shows the direction of the charged particle (e.g., proton) beam that first impacts the face of upstream side 112. Cooling of target 100 can be accomplished on the opposite downstream side 114 (from which the neutron beam exits target 100). Cap 202 can be bolted to HEBL 18, thus providing both a vacuum tight seal 206 between target 100 and vacuum region 210 of HEBL 18, and a water-tight seal 205 between target 100 and coolant inlet 204 and outlets 208.

Example Embodiments of Passivation Regions

Figure 3A:
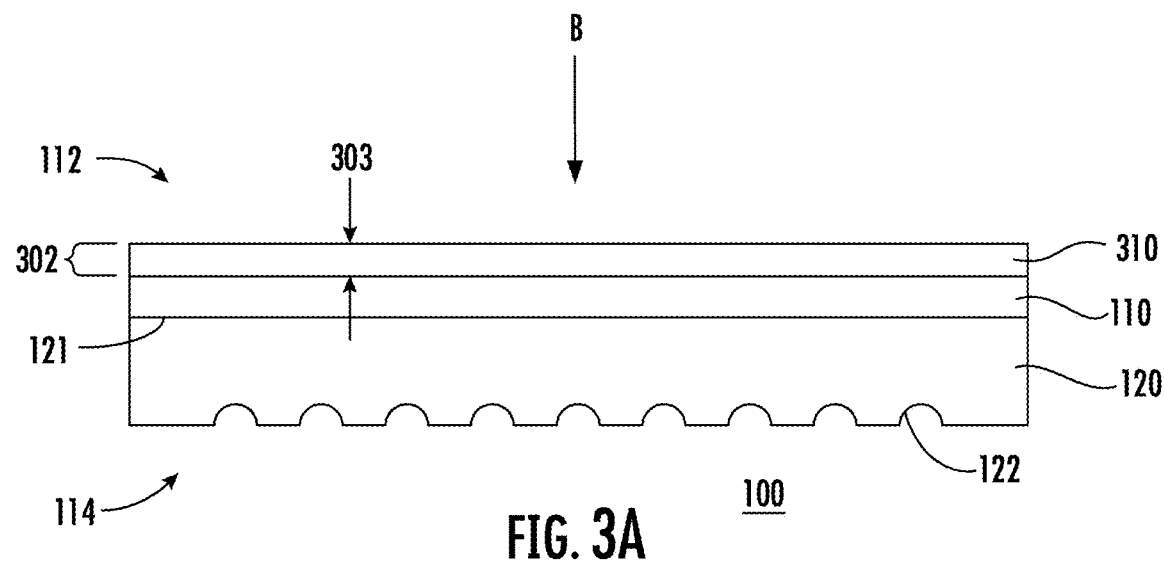
FIGS. 3A, 3B, and 3C are cross-sectional, front perspective, and rear perspective views depicting an example embodiment of a neutron generation target.
Figure 3B:
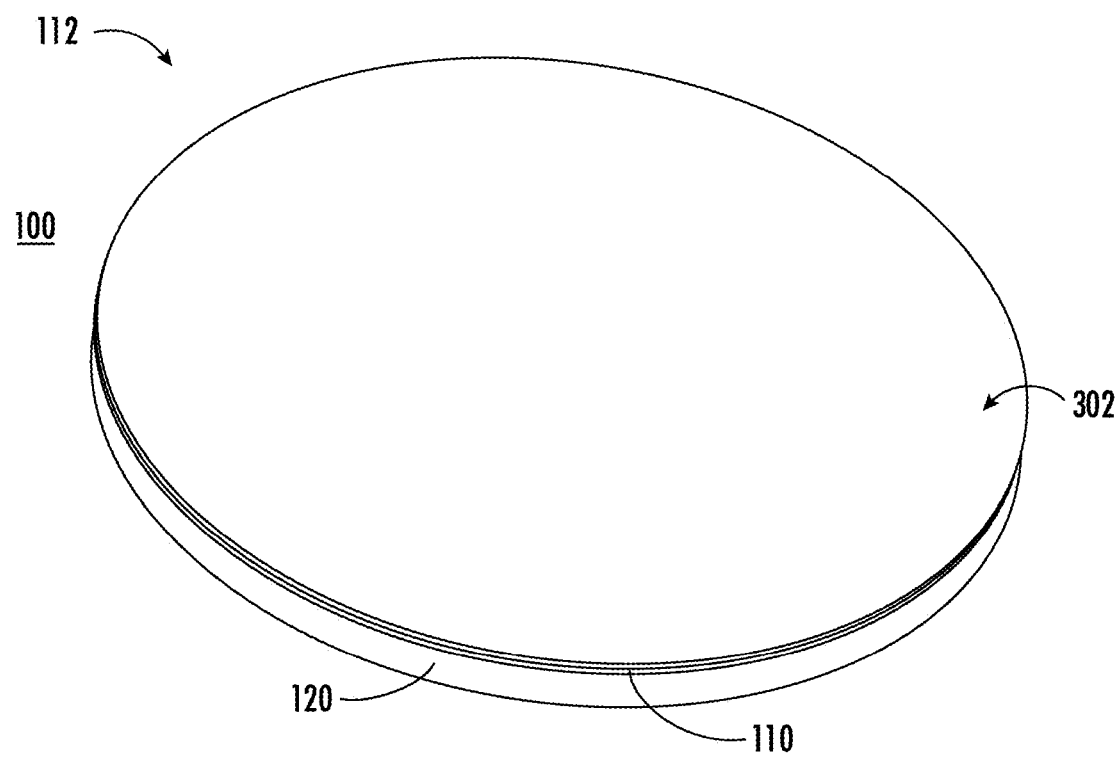
Figure 3C:
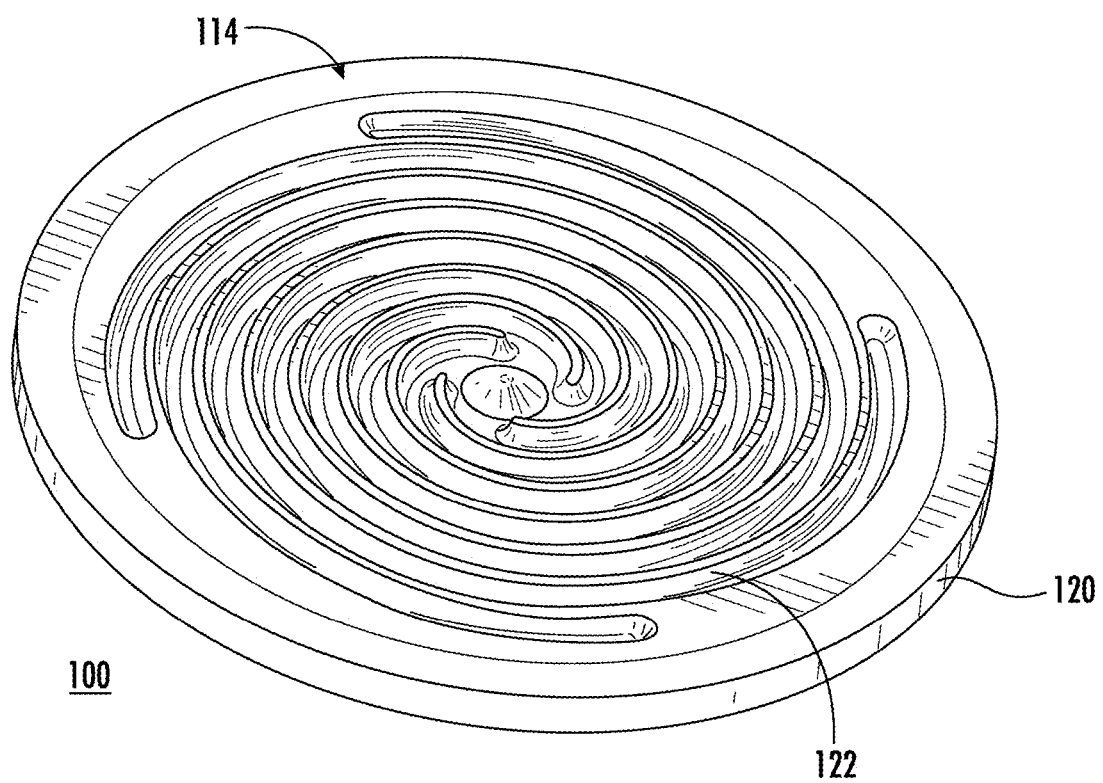

FIG. 3A is a cross-sectional view depicting an example embodiment of a passivated neutron generation target 100 for BNCT. FIGS. 3B and 3C are perspective views of an upstream side 112 and a downstream side 114, respectively, of target 100. Target 100 includes the objective material in a region 110. Several examples of objective materials are lithium (e.g., naturally abundant lithium or lithium-7) and beryllium. In a position upstream (e.g., above) of region 110, target 100 includes a passivation region 302 configured to protect region 110, such as by inhibiting diffusion as described herein. Passivation region 302 and region 110 can be configured in a variety of different shapes, including, for example, those that are planar, concave, convex, rounded, spherical or hemispherical, conical, irregular, and/or any combinations thereof.

In this embodiment region 110 is configured as a planar neutron generation layer coupled to a substrate structure 120 on a first (or upstream) surface 121 of substrate 120. A proton beam propagating in direction B (e.g., from tandem accelerator 16 along HEBL 18 (not shown)) passes through passivation region 302 and then interacts with layer 110 to produce neutrons that, in turn, pass through substrate 120 and exit from downstream side 114 of target 100. The neutron generation process converts the objective material (e.g., lithium) into a radioactive isotope (e.g., of beryllium, 7Be).

Substrate 120 can be configured for heat removal to dissipate the high energy level of the incident proton beam. Passivation region 302 and neutron generation layer 110 preferably have a total thickness that enables protons to exit layer 110 relatively soon after the proton energy drops below the threshold of the nuclear reaction for neutron formation (e.g., 1.88 MeV for lithium-7). This avoids further energy dissipation in layer 110, which is inefficient and leads to heating of layer 110 without neutron production. Protons can penetrate through neutron generation material layer 110 to substrate 120 and dissipate their remaining energy in substrate 120 or partly in substrate 120 and partly in another component located downstream of target 100. Substrate 120 can be made of a material having a high thermal conductivity, such as, for example, copper (Cu), copper-diamond powder composites, CVD diamond, and the like. Target 100 can include one or more materials to inhibit blistering, such as a tantalum layer between layer 100 and substrate 120. Downstream side 114 of substrate 120 can be actively cooled by a coolant flow through channels 122, designed to remove the heat (e.g., about 25 kilowatt (kW) heat power). Channels 122 can have a spiral configuration as depicted in FIG. 3C, or another configuration as desired.

The objective material of layer 110 may be a highly mobile or diffusive material like lithium. Passivation region 302 can be configured to inhibit (e.g., seal, against, substantially inhibit or prevent altogether) diffusion of the internal objective material of layer 110 in a downstream-to-upstream direction into or through region 302, where it may come into contact with another substance or the ambient environment. Inhibition of diffusion of the objective material can be accomplished by one or more different materials in one or more layers of region 302. In some example embodiments, passivation region 302 has a coefficient of diffusion for the objective material of $1 \times 10^{-13}$ square centimeters per second ($cm^2/s$) or less, while in other embodiments region 302 can have a coefficient of diffusion for the objective material that is $1 \times 10^{-14}$ $cm^2/s$ or less, and in still other embodiments region 302 can have a coefficient of diffusion for the objective material that is $1 \times 10^{-15}$ $cm^2/s$ or less. Example embodiments of passivation region 302, where the objective material is lithium, can have a coefficient of diffusion for lithium that is $5 \times 10^{-14}$ $cm^2/s$ or less, and in some embodiments a coefficient of diffusion for lithium that is $5 \times 10^{-15}$ $cm^2/s$ or less. All aforementioned coefficients are measured at 25 degrees Celsius and can be a characteristic of any one or more of the materials or layers (e.g., layer 310 and/or layer 410) of region 302, or characteristic of region 302 as a whole. For ease of description, this characteristic of inhibiting diffusion of the objective material may be referred to herein as a objective barrier characteristic. In the embodiment of FIGS. 3A-3C, layer 310 is configured to exhibit this objective barrier characteristic.

In embodiments employing lithium as the objective material, this characteristic may also be referred to as a lithium barrier characteristic. The lithium barrier characteristic can be exhibited in passivation region 302 by various different materials. Examples of such materials usable with any and all embodiments described herein are (or can include) one or more of lithium fluoride (LiF), lithium sulfide ($Li_2S$), or any other compounds which are thermodynamically stable with Li, magnesium fluoride ($MgF_2$), carbon (C), diamond-like carbon, (ultra)nanocrystalline diamond, or a polymer such as parylene. Other materials that are known to inhibit diffusion of lithium may be used without departing from the scope of the present disclosure. Similarly, these or other materials can be used for embodiments where the objective material is different from lithium, such as, e.g., beryllium, without departing from the scope of the present disclosure.

In neutron generation applications, materials that exhibit the reactant barrier characteristic that also contain the neutron generation material (e.g., lithium or beryllium) can provide the added benefit of neutron generation during use (e.g., in addition to the neutron generation layer). In embodiments where the neutron generation material is lithium, then the material exhibiting the lithium barrier characteristic can be lithium fluoride and/or lithium sulfide, as examples. Lithium-containing materials such as lithium nitride ($Li_3N$), lithium oxide ($Li_2O$), and lithium hydroxide (LiOH) do not exhibit substantially low lithium diffusion coefficients and are not used to exhibit the lithium barrier characteristic (e.g., as layer 310) in certain embodiments. Preferably the lithium barrier material does not directly contaminate or corrode the lithium, and is not (or does not include) a material such as aluminum, or alloys of aluminum. In some embodiments, the lithium barrier material is not beryllium nor a combination of beryllium and a metal such as aluminum.

In some embodiments, the objective barrier material does not form a eutectic combination (a combination having a melting point less than the melting points of the constituent materials taken individually) with the objective material. When the objective material is lithium, some embodiments can omit materials that form a eutectic combination with lithium, such as aluminum, silver, gold, bismuth, palladium, or zinc, or alloys of aluminum, silver, gold, bismuth, palladium, or zinc.

Region 302 can also be configured to seal against the intrusion and diffusion of externally-sourced substances (e.g., substances from the ambient environment such as air, moisture, any one or combination of oxygen, nitrogen, carbon dioxide, hydrogen, or other gases, etc.) in an upstream-to-downstream direction into or through region 302. Should such substances penetrate into target 100 then those substances can potentially contaminate or react with (e.g., oxidize) the objective material in layer 110. For ease of description, this characteristic may be referred to herein as an ambient barrier characteristic. The ambient barrier characteristic can be exhibited in an environment with normal air pressure (e.g., one atmosphere (atm)), higher pressure environments, or lower pressure environments (e.g., a vacuum or near vacuum). The ambient barrier characteristic can be exhibited in passivation region 302 by various different materials. Examples of such materials are (or can include) one or more of aluminum, silver, gold, titanium, stainless steel, aluminum silicon (AlSi), molybdenum, tungsten, tungsten carbide, tantalum, platinum, or other contamination barrier material. Other materials that are known to inhibit or prevent diffusion of contaminants of the objective material may be used without departing from the scope of the present disclosure.

In some example embodiments, the ambient barrier characteristic can have a gas permeability (measured in (cubic centimeters (cc)×millimeters (mm))/(square meters ($m^2$)× day×atmosphere (atm)) at 25 degrees C.) for oxygen, nitrogen, and carbon dioxide that is 100 or less, preferably 3.1 or less. In some example embodiments, in addition to either of these gas permeabilities, the ambient barrier characteristic can have a water vapor transmission rate (WTVR) (measured in (grams (g)×mm)/($m^2$×day) at 100 degrees Fahrenheit and 90% relative humidity) that is 0.6 or less, more preferably 0.09 or less.

The objective barrier characteristic and the ambient barrier characteristic need not be permanent, but rather can be substantial so as to inhibit diffusion for a length of time (e.g., one hour or more, one day or more, one week or more, one month or more) that is practically effective for the particular application, which can vary as stated herein. Embodiments of passivation regions 302 disclosed herein can be used to protect the neutron generation material for an extended period of time of one or more months.

Passivation region 302 can be immediately adjacent to and in contact with layer 110 or can be separated by one or more other layers or regions. In the embodiment of FIGS. 3A-3C passivation region 302 is configured with only one layer 310 (e.g., lithium fluoride) exhibiting the reactant barrier characteristic. Layer 310 can be further configured to exhibit the ambient barrier characteristic (e.g., lithium fluoride for brief duration applications).

Figure 4A:
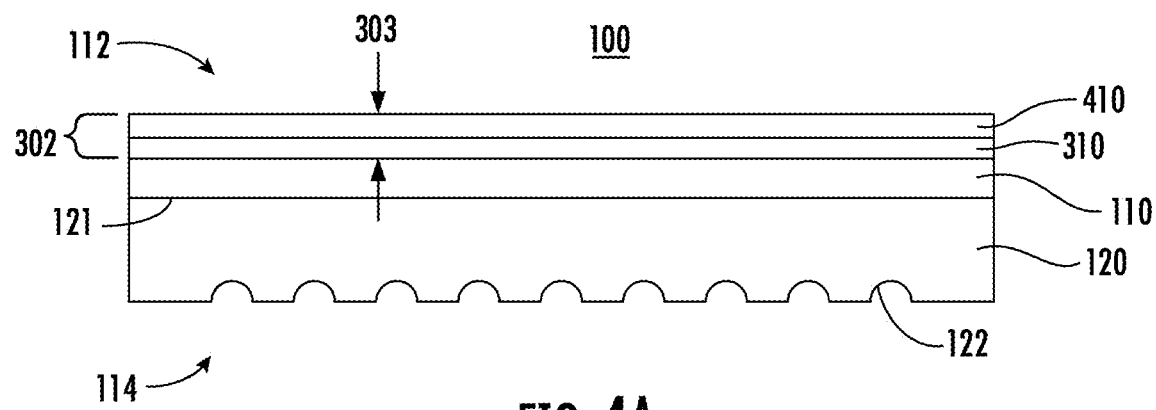
FIGS. 4A-4B are cross-sectional views depicting example embodiments of a neutron generation target.

FIG. 4A is a cross-sectional view depicting another example embodiment of a neutron generation target 100 with passivation region 302. In this embodiment, region 302 includes passivation layer 310 (positioned upstream of layer 110 as in the preceding embodiment) and an additional passivation layer 410 that is positioned upstream of and adjacent to layer 310. Layer 410 can be referred to as upstream layer 410 and layer 310 can be referred to as downstream layer 310. Upstream layer 410 can be placed on a first upstream surface of downstream layer 310, which in turn can be placed on a first upstream surface of layer 110. One or more additional layers or films may be present in region 302, such as the intervening layer described with respect to FIG. 4B.

In the embodiment of FIG. 4A, downstream layer 310 exhibits the lithium barrier characteristic and inhibits lithium of layer 110 from diffusing upwards to layer 410. Layer 310 can be, for example, lithium fluoride, or any of the other lithium barrier materials disclosed herein. Upstream passivation layer 410 exhibits the ambient barrier characteristic, and inhibits the intrusion and diffusion of externally-sourced substances that may contaminate or corrode the lithium of layer 110. Layer 410 can be, for example, aluminum, or any of the other ambient barrier materials described herein. Thus the dual layer configuration of region 302 permits layer 410 to be composed of a substance with superior sealing or barrier properties but that would otherwise corrode the lithium of layer 110, reducing the effectiveness of the lithium's neutron generation capability. Layer 310 acts as a non-reactive barrier inhibiting movement of lithium into contact with layer 410, thus minimizing any damaging or otherwise undesirable reactions. Such a configuration is particularly desirable when the objective material is highly mobile, as is the case with lithium.

In some example embodiments, the thickness of passivation region 302 (e.g., the thickness of layer 310 if present alone, or the combined thickness of layers 310 and 410) does not exceed three (3) microns in BNCT applications to minimize energy reduction of incoming protons, although region 302 is not limited to such. In other embodiments, region 302 does not exceed ten (10) microns in thickness, and in still other embodiments region 302 does not exceed 50 microns in thickness. The particular thickness of choice depends on the application, e.g., acceleration voltage or other potential difference, etc. For regions 302 with multiple layers (e.g., 310 and 410), the thickness of each layer depends upon the specific application and desired degree of inhibition of diffusion. Accordingly, broad ranges of thickness are within the scope of the present disclosure.

Figure 4B:
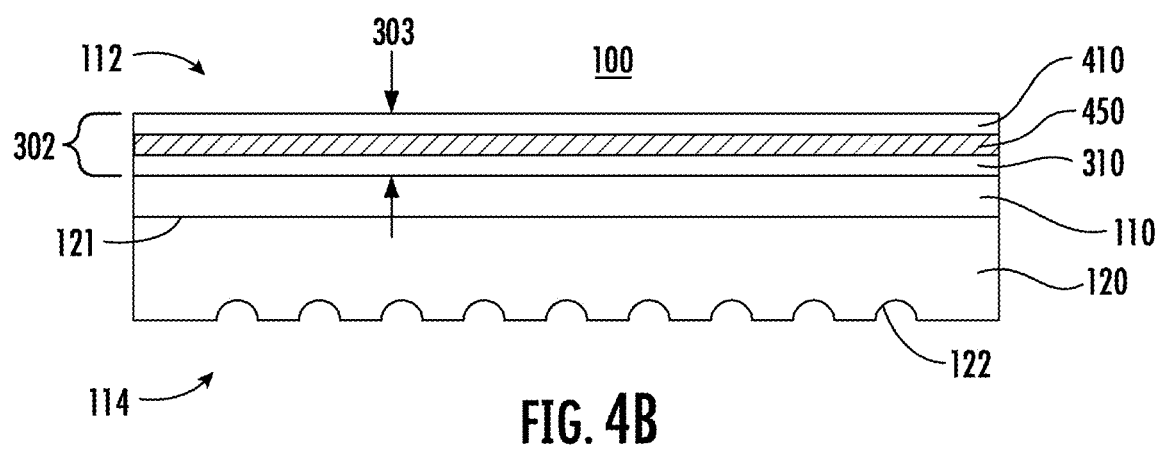

FIG. 4B is a cross-sectional view drawing depicting another example embodiment of a neutron generation target 100 with multi-layer passivation. Here, region 302 includes three passivation layers, downstream layer 310, upstream layer 410, and an intermediate layer 450 located between layers 310 and 410. Intermediate layer 450 can promote adhesion, assist in stress relief (e.g., as a polymer, shape memory alloy, etc.), or perform other functions between layer 310 and layer 410. Intermediate layer 830 can also prevent diffusion of substances between layer 310 and layer 410. In some embodiments, the layers can be deposited sequentially such that downstream layer 310 is deposited on an upstream surface of neutron generation material 110, intermediate layer 450 is deposited on an upstream surface of layer 310, and upstream layer 410 is deposited on an upstream surface of intermediate layer 450. Layers 310, 410, and/or 450 can be positioned (e.g., on layer 110) through any applicable manufacturing technique, such as deposition (e.g., chemical vapor deposition), sputtering, or with the use of adhesive, mechanical force, or other mechanism for attachment. A desired thickness of intermediate layer 450 depends upon the specific application and environment for the neutron generation target. Accordingly, varied thicknesses are within the scope of the present disclosure.

FIGS. 5-7B will be used to describe additional example embodiments with passivation. These embodiments have either a single passivation layer in region 302 (FIG. 7A) or two passivation layers in region 302. However the embodiments of FIGS. 5-7B can each be configured with one, two, three or more passivation layers within region 302.

Figure 5:
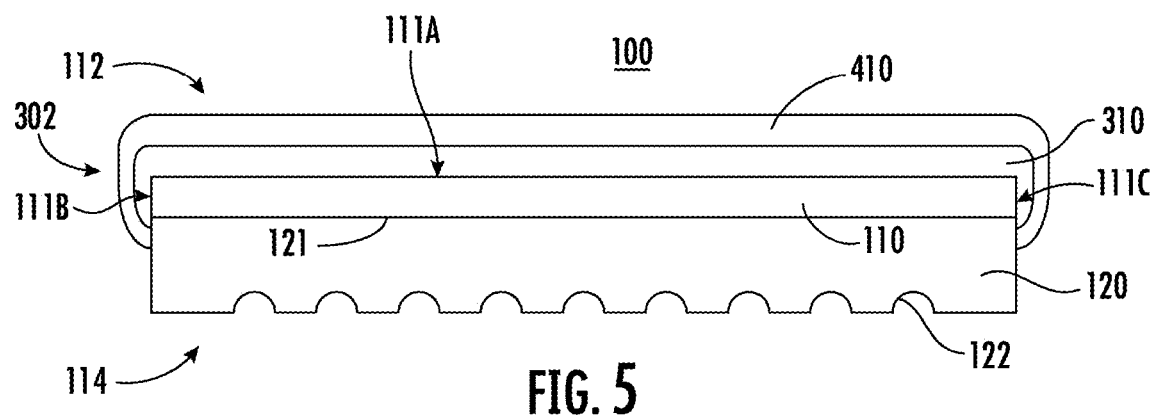
FIG. 5 is a cross-sectional view depicting an example embodiment of a neutron generation target.

FIG. 5 is cross-sectional view depicting an additional example embodiment of a neutron generation target 100 where the passivation covers both top and side surfaces of the neutron generation layer 110. Here, passivation region 302 includes layers 310 and 410 deposited (or otherwise positioned) over the topmost upstream surface 111A of neutron generation layer 110, as well as over the lateral side surfaces 111B and 111C (which can be the same side surface, e.g., as in the case of a round target 100). Both layers 310 and 410 terminate at a location downstream of (e.g., beneath) downstream surface 121. In this embodiment the lateral sides 111B and 111C of layer 110 are flush with the sides of substrate 120, although this may vary. Further, while the passivation layers 310 and 410 are depicted as thinning as they extend from the upstream surface 111A to the side surfaces 111B and 111C, their thickness can be maintained (e.g., equal or even coverage) over all surfaces.

Figure 6A:
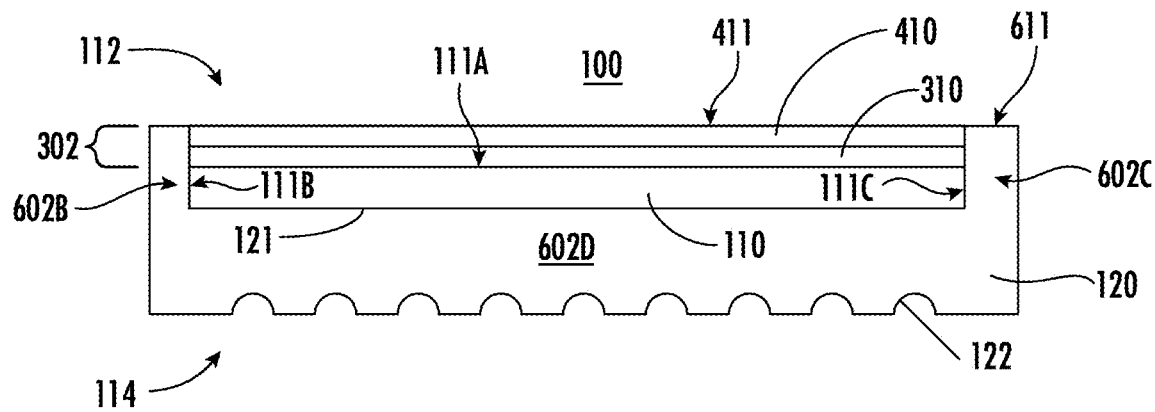
FIGS. 6A-6C are cross-sectional views depicting example embodiments of a neutron generation target.
Figure 6B:
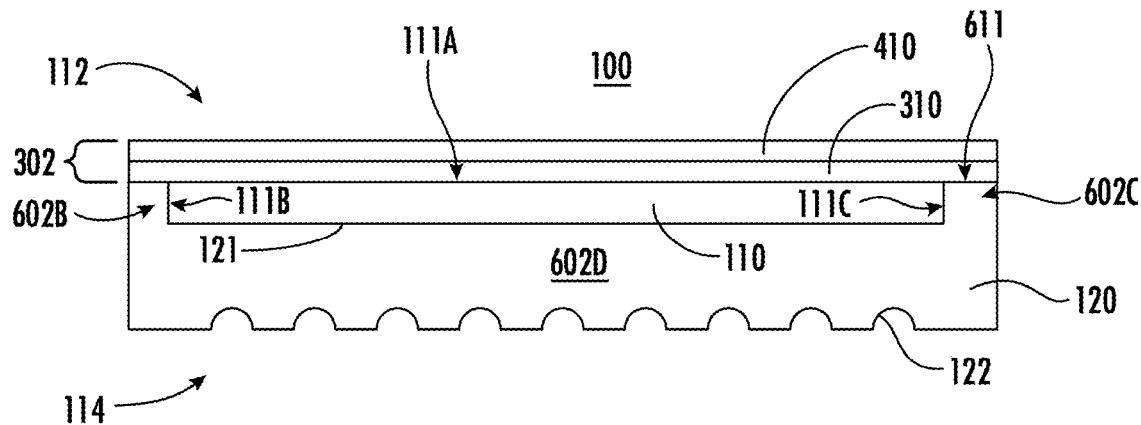
Figure 6C:
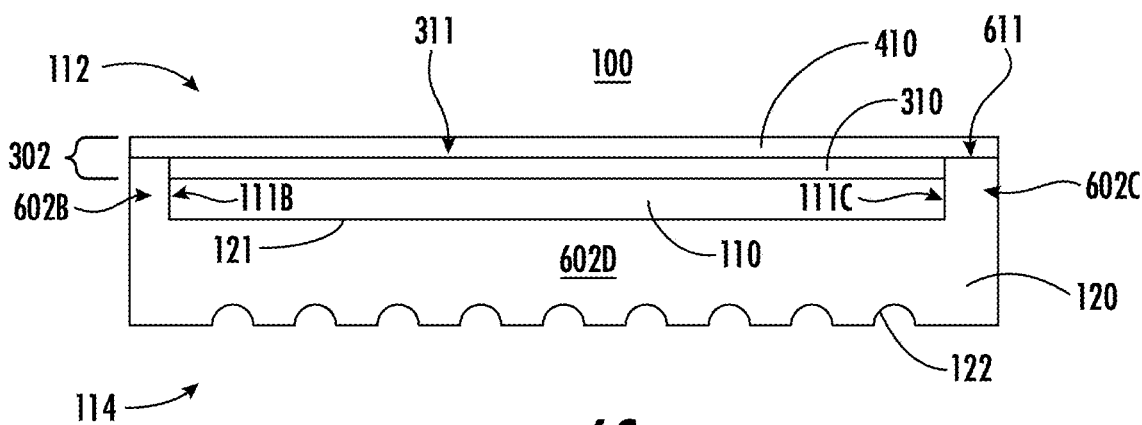

FIGS. 6A-6C are cross-sectional views depicting additional example embodiments of target 100 with passivation. In these embodiments, substrate 120 includes sidewalls 602B and 602C that partially enclose an interior volume, such as a recess or cavity, in which the neutron generation material 110 is deposited or otherwise placed. A downstream surface of material 110 is coupled to upstream surface 121 of the recess of substrate 120, such as through adhesion, an interference fit, or other manner of attachment. The recess in substrate 120 can be machined or etched into substrate 120. Substrate 120 can also (or alternatively) be of a multi-piece construction where the relatively taller sidewall portions 602B (adjacent 111B) and 602C (adjacent 111C) are attached to the central portion 602D to form the recess. In these embodiments, side protection is provided to layer 110 primarily by substrate 120

In the embodiment of FIG. 6A, passivation region 302 includes two passivation layers 310 and 410, both of which are also located within the recess in substrate 120. In some embodiments, a furthest upstream surface 411 of region 302 (e.g., of layer 402) can be flush with a furthest upstream surface 611 of substrate 120, as shown in FIG. 6A. In the embodiment of FIG. 6B, layer 110 is again placed within the recess, and passivation region 302 again includes two passivation layers 310 and 410. But in this example both of passivation layers 310 and 410 are located above layer 110 and the recess in substrate 120. Here, the furthest upstream surface 111A of layer 110 is flush with furthest upstream surface 611 of substrate 120, although embodiments can vary. In the embodiment of FIG. 6C, layer 110 and downstream passivation layer 310 are positioned within the recess, while upstream passivation layer 410 is located above layer 310 and the recess in substrate 120. Here, the furthest upstream surface 311 of layer 310 is flush with furthest upstream surface 611 of substrate 120 but, again, embodiments can vary. In embodiments with an intermediate layer 450, that layer 450 can be positioned within the recess with layers 310 and 410 (FIG. 6A), above the recess with layers 310 and 410 (FIG. 6B), or either within the recess or above the recess (as is permitted in the embodiment of FIG. 6C).

Figure 7A:
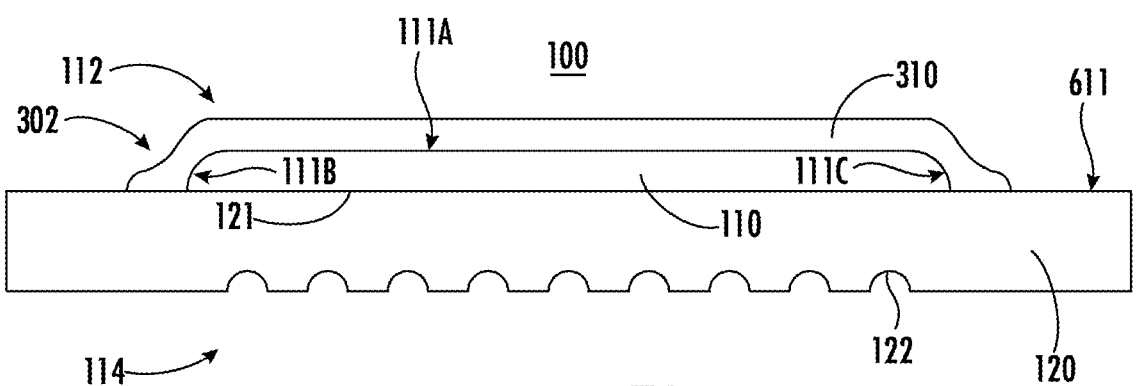
FIGS. 7A-7B are cross-sectional views depicting example embodiments of a neutron generation target.
Figure 7B:
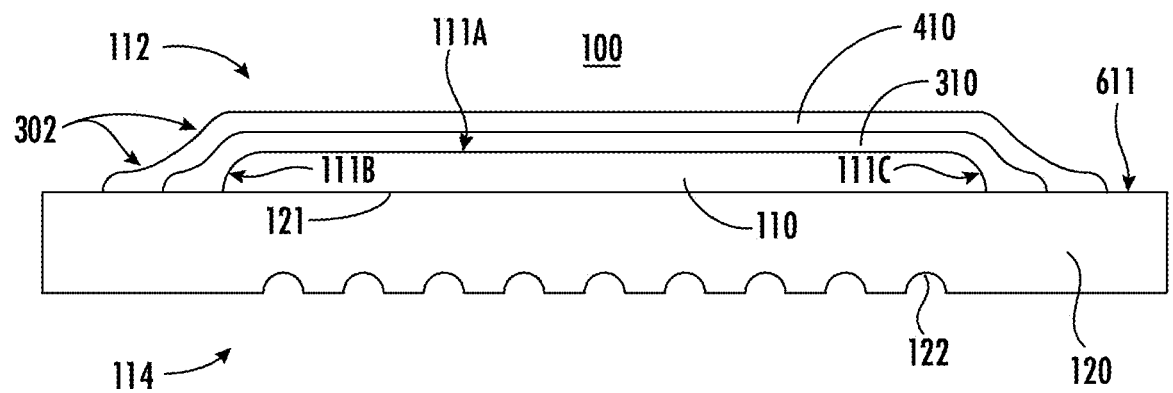

FIGS. 7A and 7B are cross-sectional views depicting additional example embodiments of neutron generation target 100. In the embodiment of FIG. 7A, layer 110 is located on upstream surface 611 of substrate 120. Passivation region 302 includes layer 310 positioned over layer 110 such that all surfaces 111A, 111B, and 111C are covered. In the embodiment of FIG. 7B, region 302 includes layer 310 positioned over layer 110 such that all surfaces 111A, 111B, and 111C are covered, and layer 410 positioned over layer 310 such that all surfaces of layer 310 are covered. Stated differently, layer 310 encapsulates layer 110, and layer 410 encapsulates both layers 310 and 110. These embodiments are relatively easy to manufacture, for example, using sequential deposition steps for each of the layers (e.g., 110, 310, and 410) without the formation of a recess.

In the embodiments of FIGS. 3A and 4A-7B, the various layers (e.g., layers 110, 310, 410, and/or 450) are shown with thicknesses that are not to scale in relation to each other and in relation to the thickness of substrate 120, with the emphasis instead placed on the relative position of the layers with respect to each other. Further, to the extent the layers (e.g., layers 110, 310, 410, and/or 450) are shown as having various cross-sectional profiles, such as rectangular side profiles with sharp edges (e.g., FIGS. 3A, 4A, 4B, and 6A-6C), or globular shaped profiles with rounded edges (e.g., FIGS. 5 and 7A-7B), or definitive linear boundaries between layers, those representations are examples only and can vary according to the needs of the particular application. Each embodiment described herein can be configured with layers having any cross-sectional profile, blended or definitive linear or non-linear boundaries, and/or any combination thereof.

Among other benefits, the example embodiments described herein can dramatically simplify the transfer of the objective material (e.g., lithium) from a production location (e.g., lab space, dry room, glovebox, or others) to a working environment (e.g., to produce neutrons for BNCT applications). In applications in which the objective material is a plasma-facing component, an upstream (e.g., upstreammost) passivation layer of the passivation region may be configured such that it interacts with the plasma without polluting the plasma. Alternatively, the upper passivation layer can be configured to burn away during an initial plasma interaction or chamber wall conditioning. In such embodiments, the objective material remains exposed to the plasma for interaction purposes, and the one or more passivation layers will have successfully provided a protective coating for transfer of the objective material from a production location to a working environment.

Experimental Results

Figure 8:
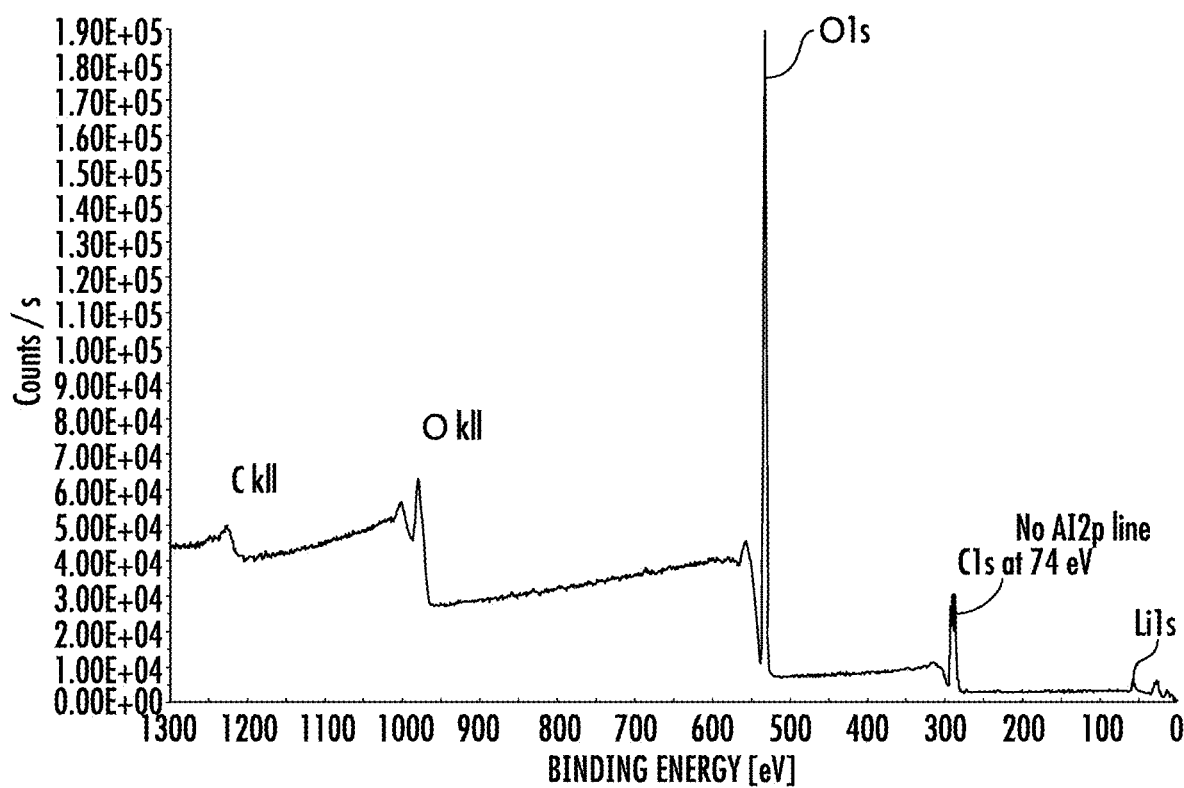
FIG. 8 is a graph depicting X-ray photoelectron spectroscopy (XPS) data experimentally collected from a sample piece.

FIG. 8 is a graph depicting data experimentally collected from a sample piece where highly pure aluminum was deposited onto clean lithium metal, which was then exposed to air. X-ray photoelectron spectroscopy (XPS) was used to collect the spectrum data depicted here, which indicates the composition of the species on the surface (within several nanometers) of the deposited aluminum after two weeks had elapsed since the original aluminum deposition. These results show that no aluminum remained on the surface at this time. It was concluded that, for this sample, lithium diffused readily through the surface layer of aluminum and then reacted with components in air. Aluminum may have also diffused into the underlying lithium layer. In embodiments where the objective material is lithium or another highly mobile species, passivation region 302 preferably has the capability to substantially inhibit, and even prevent, lithium from diffusing through the passivation region to a location where it can react without other components, e.g., oxygen, water, and carbon dioxide.

Figure 9:
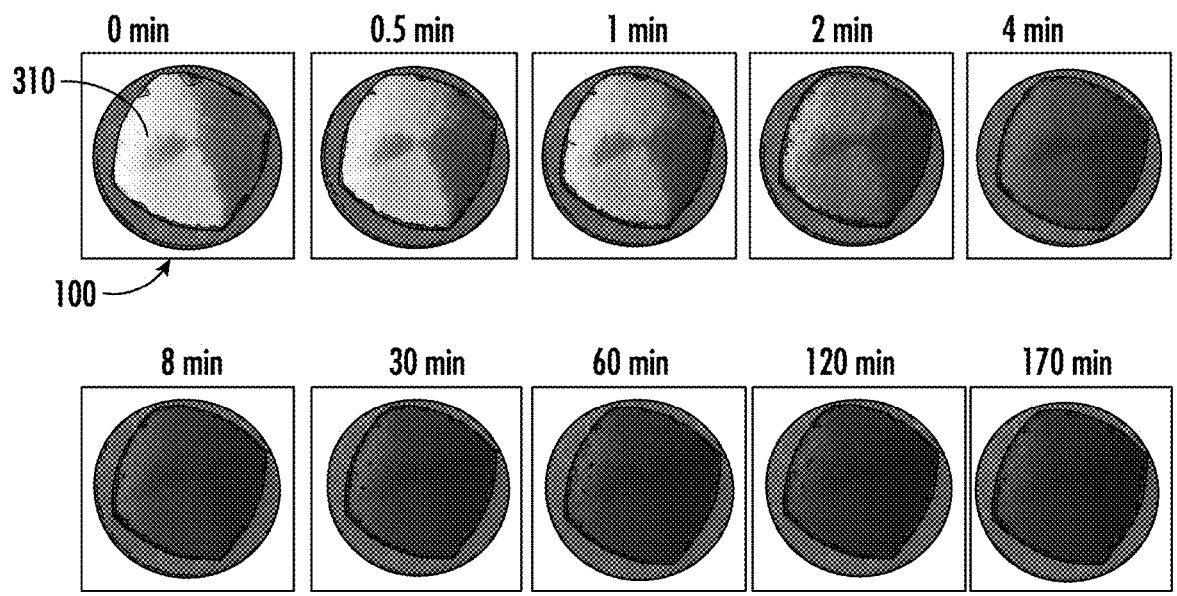
FIG. 9 includes a time sequence series of top-down photographs depicting an example embodiment of target with a passivation region containing lithium fluoride.

FIG. 9 includes a series of top-down (upstream-to-downstream) photographs depicting an example embodiment of target 100 configured as depicted in the cross-sectional view of FIG. 7A, where a neutron generation layer 110, composed mainly of naturally abundant lithium, is covered by passivation region 302 having only one passivation layer 310, where that layer 310 is composed of lithium fluoride. In this example layer 310 has a thickness of 500 nm. Target 100 was removed from the inert gas atmosphere within a glovebox and placed in an ambient laboratory setting with normal atmosphere having a humidity level of 50%. Each photograph was taken at a specific time measured from the approximate first instant (time zero) where target 100 was first exposed to the atmosphere in the laboratory setting. Time zero is the photograph at top left labeled zero minutes (0 min), and the photograph on the top row second from left was taken 30 seconds (0.5 min) from time zero, the photograph in the middle of the top row was taken one minute (1 min) from time zero and so forth until the final photo was taken at 170 minutes after time zero (bottom row, far right).

Naturally abundant lithium typically reacts almost immediately with the surrounding atmosphere (e.g., 20-60% relative humidity), and can form a dark color lithium nitride ($Li_3N$) topcoat within seconds (e.g., 10-30 seconds) of atmospheric exposure. Here, at time zero, the lithium visible through the LiF topcoat appears shiny (the same appearance as when within the glovebox), indicating little to no reaction of the lithium with its surroundings. Several minutes later the color of target 100 turned yellow (e.g., 2 min), and then brown (e.g., 4 min), and then ultimately turns dark purple or black after an hour or two, indicating $Li_3N$ formation on the lithium-LiF interface 311. Thus, the LiF passivation layer 310 substantially delayed lithium contamination and thereby offers substantial improvement over targets without passivation, and those with solely an aluminum passivation layer as described with respect to FIG. 8.

Figure 10A:
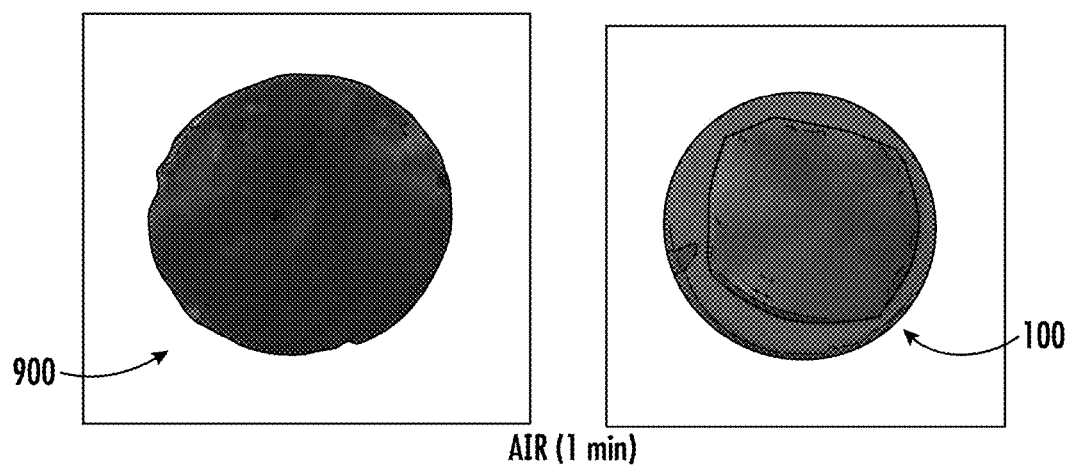
FIGS. 10A-10C include a time sequence series of top-down photographs depicting a bare lithium substrate (left) adjacent to an example embodiment of target (right).
Figure 10B:
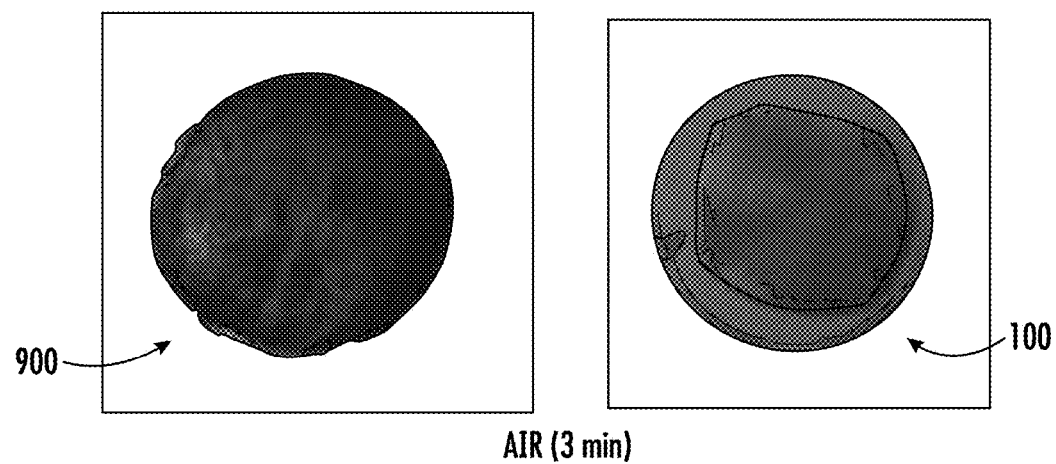
Figure 10C:
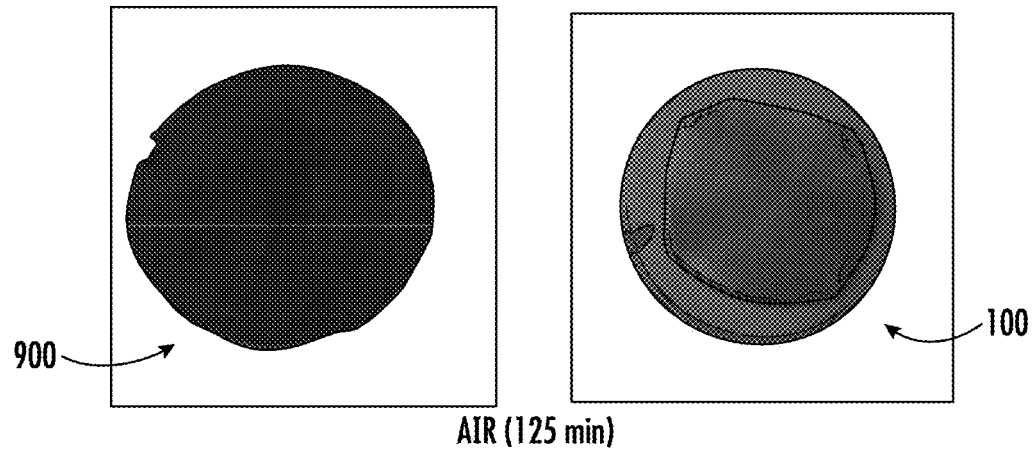

FIGS. 10A-10C include a series of top-down (upstream-to-downstream) photographs depicting a bare lithium substrate 900 (left) adjacent to an example embodiment of target 100 (right). Substrate 900 includes a copper substrate with a bare coating of naturally abundant lithium, and does not have a passivation region. The lithium is available to freely react with the ambient atmosphere. Target 100 is configured as depicted in the cross-sectional view of FIG. 7B, with a neutron generation layer 110 composed of naturally abundant lithium, which is covered by a passivation region 302 having two passivation layers 310 and 410. Cooling channels were omitted. Layer 310 is composed of LiF with a thickness of 900 nm, and layer 410 is composed of aluminum with a thickness of 400 nm.

Both samples were removed from an inert gas atmosphere within a glovebox and placed in an ambient laboratory setting with normal atmosphere having a humidity of 50%. The photos of FIG. 10A were taken at one minute after the approximate instant where target 100 and substrate 900 were first exposed to air in the laboratory setting. The photos of FIG. 10B were taken 3 minutes after first exposure, and the photos of FIG. 10C were taken 125 minutes after first exposure. The bare lithium substrate 900 reacts almost immediately with the surrounding atmosphere and has already discolored at one minute, turning a darker shade of purple at three minutes, and ultimately turning black at 125 minutes. Conversely, target 100 shows little to no discoloration even at 125 minutes. The lack of lithium discoloration was subsequently confirmed by inspection upon removing aluminum layer 410. These results, taken in combination with the results of FIGS. 8 and 9, indicate that the two-layer passivation region 302 amply protects lithium layer 110 from contamination such as nitride formation, even after two hours of exposure. Stated differently, LiF layer 310 has substantially inhibited lithium from diffusing in the upstream direction through layer 310, and aluminum layer 410 has substantially inhibited atmospheric reactants from diffusing in the downstream direction through layer 410.

Figure 11:
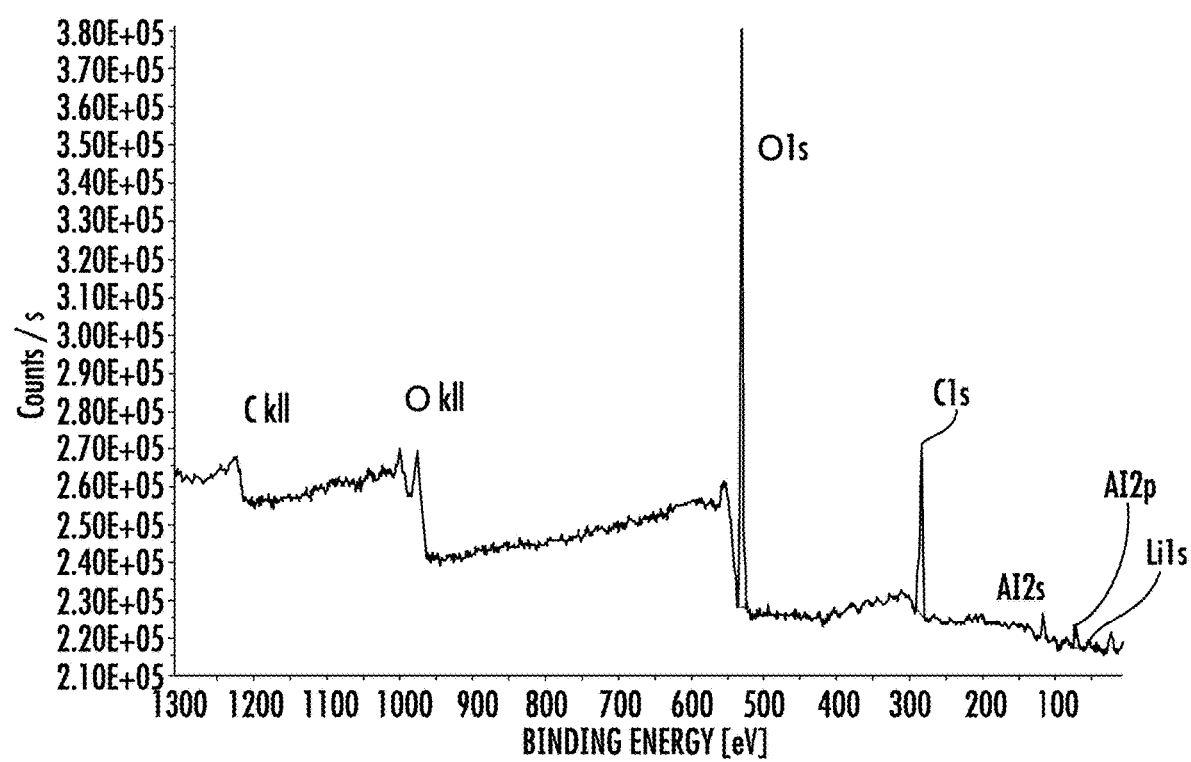
FIG. 11 is a graph depicting XPS data experimentally collected from a sample piece.

FIG. 11 is a graph depicting data experimentally collected from an example target 100 configured similar to that described with respect to FIGS. 10A-10C, where a layer of naturally abundant lithium was covered with a LiF layer 310 (900 nm thick), which in turn was covered with an aluminum layer 410 (400 nm thick). The target was then exposed to air for multiple days. X-ray photoelectron spectroscopy (XPS) was used to collect the spectrum data depicted in FIG. 11. Unlike the results of FIG. 8 where no aluminum remained on the surface of the aluminum coating, the results here show that the surface composition of aluminum layer 410 still includes aluminum. This indicates that, although some lithium is present on the surface, the LiF layer 310 has substantially impeded migration of the lithium to the aluminum surface where it would otherwise react and conceal the aluminum as occurred in the example of FIG. 8.

Example Embodiments of Passivation Region Thicknesses

Tables 1-4 provide modeled values to facilitate description of thickness characteristics of some embodiments of passivation regions 302 used with an example BNCT application where a proton beam collides with a target lithium layer on a substrate to produce neutrons. Neutron generation targets are typically not conducive to the use of a thick passivation region over the neutron generation material, as the thick passivation region reduces the energy of the incident protons and decreases the effectiveness of neutron generation.

Table 1 illustrates the range (sometimes referred to as stopping range) of the incident proton particle in naturally abundant lithium (approx. 92% lithium-7) for several proton energies. In the right column the variable "depth-to-threshold" is listed, and represents the distance which an average proton travels inside of the material before it slows down to the threshold energy for a 7Li(p,n)7Be reaction (about 1.88 MeV). After a proton is slowed past this threshold energy it can no longer produce neutrons. For instance, for a proton energy of 2.50 Mega electron-volts (MeV), the highly energetic proton enters the lithium material and then travels about 90 microns in lithium until it slows to the threshold energy. In this example, if the lithium thickness is less than 90 microns (um), the neutron yield would be decreased and the lithium material is not utilized most efficiently. It is practically desirable to have a sufficiently thick lithium layer for the neutron-producing target, but not so thick (e.g., 200 um) that reduction of the proton's energy below the threshold dissipates excessive heat in the lithium.

TABLE 1

Lithium Range in Natural Abundance ~7Li~6Li

| Proton Energy (MeV) | Range in Lithium (um) | Depth to Threshold (um) |
|---|---|---|
| 3.00 | 319.77 | 176.27 |
| 2.75 | 274.89 | 131.39 |
| 2.50 | 233.11 | 89.61 |
| 2.25 | 194.48 | 50.98 |
| 2.00 | 159.08 | 15.58 |
| 1.88 | 143.50 | 0.00 |
| 1.80 | 133.12 | NA |

In embodiments with a protective covering on top of the lithium, the protective covering will additionally slow down the proton. Table 2 shows the same proton range for the incident proton as in Table 1, but for the data in Table 2 a protective covering composed of one micron thick lithium fluoride (LiF) layer has been added on top of naturally abundant lithium.

TABLE 2

| Proton Energy (MeV) | Range in LiF (um) | Energy entering Li (MeV) | Range in Li (um) | Depth to Threshold (um) |
|---|---|---|---|---|
| 3.00 | 72.49 | 2.97 | 315.18 | 171.68 |
| 2.75 | 62.71 | 2.72 | 270.31 | 126.81 |
| 2.50 | 53.58 | 2.47 | 228.55 | 85.05 |
| 2.25 | 45.10 | 2.21 | 189.95 | 46.44 |
| 2.00 | 37.29 | 1.97 | 154.58 | 11.08 |
| 1.80 | 31.52 | 1.74 | NA | NA |

For a proton incident energy of 2.5 MeV, the one micron thick LiF layer slows the proton by 0.03 MeV (2.5 MeV-2.47 MeV). This slightly decreases the depth to threshold by approximately 4.5 microns.

Table 3 illustrates proton ranges associated with embodiments having a 0.5 micron thick upstream passivation layer 410 composed of aluminum on top of the one micron thick downstream passivation layer 310 (LiF) and the underlying lithium. This configuration is similar to that described with respect to FIG. 7 and FIG. 10.

TABLE 3

| Proton Energy (MeV) | Range in Al (um) | Energy entering Li (MeV) | Range in Li (um) | Depth to Threshold (um) |
|---|---|---|---|---|
| 3.00 | 80.38 | 2.96 | 313.09 | 169.58 |
| 2.75 | 69.67 | 2.71 | 268.23 | 124.73 |
| 2.50 | 59.64 | 2.46 | 226.49 | 82.99 |
| 2.25 | 50.28 | 2.20 | 187.90 | 44.40 |
| 2.00 | 41.63 | 1.95 | 152.56 | 9.05 |

TABLE 3-continued

| Proton Energy (MeV) | Range in Al (um) | Energy entering Li (MeV) | Range in Li (um) | Depth to Threshold (um) |
|---|---|---|---|---|
| 1.80 | 35.22 | 1.72 | NA | NA |

Table 3 illustrates that a 1.5 micron thick two-layer passivation region does not significantly slow down the protons. Because the passivation region having the multiple passivation layers is thin, major incident particle energy loss is not experienced in the region.

In contrast, if the passivation region is relatively thick, proton energy significantly decreases, which is not necessarily desirable for practical neutron-producing devices, as it may be difficult to accelerate particles to a higher energy. Table 4 illustrates how a relatively thick (10 micron) protective layer of Parylene C performs when placed over natural abundant lithium. Parylene C is a widely used polymer consisting mostly of low Z elements and used for passivating electronics as Parylene C protects from moisture.

In Table 4, for the same energy of 2.50 MeV, the 10 micron layer of Parylene C slows down the proton by approximately 0.20 MeV, thus decreasing the depth-to-threshold by almost 30% compared to bare lithium (Table 1) and further illustrating the depth to threshold dependence on thickness of the passivation region. Most metallic passivation of equivalent thickness would slow down the protons more than the polymeric Parylene C.

TABLE 4

| Proton Energy (MeV) | Range in Parylene C (um) | Energy entering Li (MeV) | Range in Li (um) | Depth to Threshold (um) |
|---|---|---|---|---|
| 3.00 | 125.83 | 2.86 | 293.77 | 150.26 |
| 2.75 | 108.57 | 2.59 | 248.96 | 105.45 |
| 2.50 | 92.46 | 2.33 | 207.27 | 63.77 |
| 2.25 | 77.51 | 2.07 | 168.75 | 25.25 |
| 2.00 | 63.75 | 1.80 | 133.48 | NA |
| 1.80 | 53.61 | 1.46 | NA | NA |

The passivation regions of embodiments described herein can form a relatively thin passivation covering. The ideal thickness of passivation region 302 is dependent on the particular application, which can vary as set forth herein. For example, in some embodiments the thickness (measured upstream-downstream along the beam axis, see e.g., numeral 303 in FIGS. 3A, 4A, and 4B) of the entire passivation region 302 is 100 microns or less. In some embodiments, the thickness of passivation region 302 is 50 microns or less. In certain applications, like BNCT, even thinner passivation regions 302 are desirable, although not required. For example, in these and other embodiments, the thickness of passivation region 302 is 10 microns or less, or in some embodiments the thickness of passivation region 302 is 5 microns or less, or in some other embodiments the thickness of passivation region 302 is 3 microns or less, and in some other embodiments the thickness of passivation region 302 is 1 (one) micron or less.

The thickness of the objective material can be as desired to meet the needs of the application. In BNCT applications, the desired thickness may depend on the incident proton energy, and may, for example, range between 10 microns and 300 microns. In an example embodiment where the energy of the incident proton beam is 1.88 MeV to 3 MeV, thickness of the lithium layer may be 10-200 microns, and in an example embodiment where the energy of the incident proton beam is 2.25 MeV to 2.75 MeV, thickness of the lithium layer may be 40-150 microns. In one example embodiment, a lithium layer has a thickness of between 40-150 microns, with a two-layer passivation region 302 located over it. The downstream layer 310 can be lithium fluoride and the upstream layer 410 can be a metal such as aluminum, titanium, stainless steel, alloys thereof, and the like. The thickness of region 302 can be in accordance with any of the embodiments described herein. In one example embodiment, layer 310 has a thickness in the range of 200-400 nm, and layer 410 has a thickness in the range of 500-800 nm.

In some example embodiments, passivation region 302 (e.g., all or a portion thereof such as layer 310, 410, 450, etc.) can be removed during operation of the system in which it is placed. For example, in BNCT applications, incidence of the particle beam on passivation region 302 can cause region 302 to be removed (e.g., ablated or burned) from target 100 during operation. The removal can be the result of elevation in temperature in region 302 as a result of the highly energetic particle beam. The resulting neutron generation reaction can also facilitate this degradation of region 302. Removal of region 302 can increase the efficiency of neutron generation by the neutron generation layer 110 by reducing the energy loss experienced by incoming particles slowing down through passivation region 302. The particle beam may be moved (e.g., rastered) over the target surface, and all or part of region 302 may be removed over the fractional region of the surface of the target where incidence of the particle beam on the target is at the relative highest level (e.g., duration) as compared to surrounding regions of the target.

The embodiments described herein can also find applicability in battery design and manufacturing. The rapidly developing lithium batteries industry suffers from limitations of the sensitivity of lithium to humid atmospheres. The embodiments described herein can be applied where the device being protected or passivated is a metallic lithium anode of a battery. The embodiments can simplify and decrease the cost of fabricating the metallic lithium anode, which is stable in the ambient atmosphere (e.g., air) and dendrite free.

Various aspects of the present subject matter are set forth below, in review of, and/or in supplementation to, the embodiments described thus far, with the emphasis here being on the interrelation and interchangeability of the following embodiments. In other words, an emphasis is on the fact that each feature of the embodiments can be combined with each and every other feature unless explicitly stated otherwise or logically implausible.

In various embodiments, a neutron generation target includes a substrate, a neutron generation region positioned over the substrate, and a passivation region positioned over the neutron generation region. In some of these embodiments, the neutron generation region includes an objective material configured to generate neutrons and the passivation region is configured to seal against the diffusion of the objective material into the passivation region.

In some of these embodiments, the passivation region has a coefficient of diffusion for the objective material of $1\times10^{-13}$ square centimeters per second ($cm^2/s$) or less. In some of these embodiments, the passivation region has a coefficient of diffusion for the objective material that is $1\times10^{-14}$ $cm^2/s$ or less. In some of these embodiments, the passivation region has a coefficient of diffusion for the objective material that is $1\times10^{-15}$ $cm^2/s$ or less.

In some of these embodiments, the objective material is lithium. In some of these embodiments, the passivation region has a coefficient of diffusion for lithium that is $5\times10^{-14}$ $cm^2/s$ or less.

In some of these embodiments, the objective material is lithium. In some of these embodiments, the passivation region has a coefficient of diffusion for lithium that is $5\times10^{-15}$ $cm^2/s$ or less.

In some of these embodiments, the passivation region includes lithium fluoride.

In some of these embodiments, the passivation region includes lithium fluoride, lithium sulfide, magnesium fluoride, carbon (C), diamond-like carbon, (ultra)nanocrystalline diamond, or a polymer.

In some of these embodiments, the passivation region includes lithium. In some of these embodiments, the passivation region does not include lithium nitride, lithium oxide, nor lithium hydroxide.

In some of these embodiments, the passivation region includes a layer in contact with the object material. In some of these embodiments, the layer does not include aluminum nor beryllium.

In some of these embodiments, the passivation region has a thickness of 10 microns or less.

In some of these embodiments, the passivation region has a thickness of three microns or less.

In some of these embodiments, the target is configured for use in a boron neutron capture therapy (BNCT) procedure.

In some of these embodiments, the target is configured to generate neutrons when exposed to a proton beam having an energy between 1.88 and 3.0 mega-electron volts (MeV).

In some of these embodiments, the passivation region is configured to be removed during operation.

In some of these embodiments, the objective material includes lithium.

In some of these embodiments, the passivation region does not include a eutectic combination of the objective material and another material.

In various embodiments, a neutron generation target includes a substrate, a neutron generation region positioned over the substrate and including an objective material configured to generate neutrons, and a passivation region positioned over the neutron generation region and including a downstream layer and an upstream layer. In some of these embodiments, the downstream layer is configured to seal against the diffusion of the objective material into the passivation region.

In some of these embodiments, the downstream layer has a coefficient of diffusion for the objective material of $1\times10^{-13}$ square centimeters per second ($cm^2/s$) or less. In some of these embodiments, the downstream layer has a coefficient of diffusion for the objective material that is $1\times10^{-14}$ $cm^2/s$ or less. In some of these embodiments, the downstream layer has a coefficient of diffusion for the objective material that is $1\times10^{-15}$ $cm^2/s$ or less.

In some of these embodiments, the objective material is lithium. In some of these embodiments, the downstream layer has a coefficient of diffusion for lithium that is $5\times10^{-14}$ $cm^2/s$ or less.

In some of these embodiments, the objective material is lithium. In some of these embodiments, the downstream layer has a coefficient of diffusion for lithium that is $5\times10^{-15}$ $cm^2/s$ or less.

In some of these embodiments, the downstream layer includes lithium fluoride.

In some of these embodiments, the downstream layer includes lithium fluoride, lithium sulfide, magnesium fluoride, carbon (C), diamond-like carbon, (ultra)nanocrystalline diamond, or a polymer.

In some of these embodiments, the downstream layer includes lithium. In some of these embodiments, the downstream layer does not include lithium nitride, lithium oxide, nor lithium hydroxide.

In some of these embodiments, the downstream layer does not include aluminum nor beryllium.

In some of these embodiments, the upstream layer is configured to seal against the diffusion of an ambient substance into the passivation region.

In some of these embodiments, the upstream layer is configured to seal against the diffusion of a substance from the atmosphere into the passivation region.

In some of these embodiments, the upstream layer is configured to seal against the diffusion of oxygen, nitrogen, and water into the passivation region.

In some of these embodiments, the upstream layer is configured to seal against the diffusion of an ambient substance through the upstream layer of the passivation region and into contact with the downstream layer.

In some of these embodiments, the upstream layer includes aluminum, titanium, platinum, nickel, steel, silver, gold, stainless steel, aluminum silicon, molybdenum, tungsten, tungsten carbide, and/or or tantalum.

In some of these embodiments, the upstream layer has a gas permeability for oxygen, nitrogen, and carbon dioxide that is 100 or less, measured in (cubic centimeters×millimeters)/(square meters×day×atmosphere).

In some of these embodiments, the upstream layer has a gas permeability for oxygen, nitrogen, and carbon dioxide that is 3.1 or less, measured in (cubic centimeters×millimeters)/(square meters×day×atmosphere).

In some of these embodiments, the upstream layer has a water vapor transmission rate (WTVR) that is 0.6 or less, measured in (grams×millimeters)/(square meters×day).

In some of these embodiments, the upstream layer has a water vapor transmission rate (WTVR) that is 0.09 or less, measured in (grams×millimeters)/(square meters×day).

In some of these embodiments, the upstream layer is in contact with the downstream layer.

In some of these embodiments, the passivation region includes an intermediate layer between the upstream layer and the downstream layer.

In some of these embodiments, the passivation region has a thickness of 10 microns or less.

In some of these embodiments, the passivation region has a thickness of three microns or less.

In some of these embodiments, the target is configured for use in a boron neutron capture therapy (BNCT) procedure.

In some of these embodiments, the target is configured to generate neutrons when exposed to a proton beam having an energy between 1.88 and 3.0 mega-electron volts (MeV).

In some of these embodiments, at least a portion of the passivation region is configured to be removed during operation.

In some of these embodiments, the objective material includes lithium.

In various embodiments, a method of manufacturing a target for boron neutron capture therapy includes applying a neutron generation region to a substrate, and applying a passivation region over the neutron generation region. In some of these embodiments, the neutron generation region includes an objective material configured to generate neutrons and the passivation region is configured to seal against the diffusion of the objective material into the passivation region.

In some of these embodiments, a downstream layer of the passivation region is configured to seal against the diffusion of the objective material into the passivation region.

In some of these embodiments, the method further includes applying an upstream layer of the passivation region over the downstream layer. In some of these embodiments, the upstream layer is in contact with the downstream layer and/or the downstream layer is in contact with the neutron generation region.

In some of these embodiments, the neutron generation region and passivation region are configured in accordance with any of the aforementioned embodiments.

In some of these embodiments, the neutron generation region and passivation region are configured in accordance with any of the aforementioned embodiments.

In various embodiments, a method of producing neutrons includes applying a particle beam to a target such that particles from the particle beam traverse a passivation region and generate neutrons upon impacting a neutron generation region of the target. In some of these embodiments, the passivation region is configured to seal against diffusion of a material of the neutron generation region into the passivation region. In some of these embodiments, the method further includes continuing application of the particle beam to the target such that at least a portion of the passivation region is removed.

In some of these embodiments, the target is configured in accordance with any of the aforementioned embodiments.

In some of these embodiments, the passivation region includes an upstream layer and a downstream layer. In some of these embodiments, both the upstream layer and the downstream layer are removed by continued application of the particle beam in a region of the target.

In some of these embodiments, the method is performed as part of a boron neutron capture therapy (BNCT) procedure.

In various embodiments, a target device includes a substrate including a recess, a neutron generation region in the recess of the substrate, and a passivation region positioned over the neutron generation region. In some of these embodiments, the passivation region includes an upstream layer and a downstream layer. In some of these embodiments, the downstream layer is located in the recess.

In some of these embodiments, the upstream layer is located in the recess. In some of these embodiments, the substrate includes a sidewall adjacent the recess. In some of these embodiments, the downstream layer does not extend over an upstream surface of the sidewall.

In some of these embodiments, the upstream layer does not extend over the upstream surface of the sidewall.

In some of these embodiments, the upstream layer extends over the upstream surface of the sidewall.

In some of these embodiments, the target is configured in accordance with any of the aforementioned embodiments.

In various embodiments, a target device includes a substrate and a neutron generation region positioned over the substrate. In some of these embodiments, the neutron generation region includes an upstream surface and a sidewall surface. In some of these embodiments, the target device further includes a passivation region positioned over the upstream surface and the sidewall surface of the neutron generation region.

In some of these embodiments, the passivation region and substrate encompass the neutron generation region.

In some of these embodiments, the target is configured in accordance with any of the aforementioned embodiments.

In various embodiments, a device includes a substrate, a first region positioned over the substrate and including lithium, and a passivation region positioned over the first region. In some of these embodiments, the passivation region is configured to seal against diffusion of lithium into the passivation region.

In some of these embodiments, the first material is lithium. In some of these embodiments, the passivation region has a coefficient of diffusion for lithium that is $5 \times 10^{-14}$ cm$^2$/s or less.

In some of these embodiments, the first material is lithium. In some of these embodiments, the passivation region has a coefficient of diffusion for lithium that is $5 \times 10^{-15}$ cm$^2$/s or less.

In some of these embodiments, the passivation region includes lithium fluoride.

In some of these embodiments, the passivation region includes lithium fluoride, lithium sulfide, magnesium fluoride, carbon (C), diamond-like carbon, (ultra)nanocrystalline diamond, or a polymer.

In some of these embodiments, the passivation region includes lithium. In some of these embodiments, the passivation region does not include lithium nitride, lithium oxide, nor lithium hydroxide.

In some of these embodiments, the passivation region has a thickness of 100 microns or less.

In some of these embodiments, the passivation region has a thickness of 50 microns or less.

In various embodiments, a device includes a substrate, a first region positioned over the substrate and including lithium, and a passivation region positioned over the first region and including a downstream layer and an upstream layer. In some of these embodiments, the downstream layer is configured to seal against the diffusion of lithium into the passivation region.

In some of these embodiments, the downstream layer has a coefficient of diffusion for lithium that is $5 \times 10^{-14}$ cm$^2$/s or less.

In some of these embodiments, the downstream layer has a coefficient of diffusion for lithium that is $5 \times 10^{-15}$ cm$^2$/s or less.

In some of these embodiments, the downstream layer includes lithium fluoride.

In some of these embodiments, the downstream layer includes lithium fluoride, lithium sulfide, magnesium fluoride, carbon (C), diamond-like carbon, (ultra)nanocrystalline diamond, or a polymer.

In some of these embodiments, the downstream layer includes lithium. In some of these embodiments, the downstream layer does not include lithium nitride, lithium oxide, nor lithium hydroxide.

In some of these embodiments, the downstream layer does not include aluminum nor beryllium.

In some of these embodiments, the upstream layer is configured to seal against diffusion of an ambient substance into the passivation region.

In some of these embodiments, the upstream layer is configured to seal against the diffusion of a substance from the atmosphere into the passivation region.

In some of these embodiments, the upstream layer is configured to seal against the diffusion of oxygen, nitrogen, and water into the passivation region.

In some of these embodiments, the upstream layer is configured to seal against the diffusion of an ambient substance through the upstream layer of the passivation region and into contact with the downstream layer.

In some of these embodiments, the upstream layer has a gas permeability for oxygen, nitrogen, and carbon dioxide that is 100 or less, measured in (cubic centimeters×millimeters)/(square meters×day×atmosphere).

In some of these embodiments, the upstream layer has a gas permeability for oxygen, nitrogen, and carbon dioxide that is 3.1 or less, measured in (cubic centimeters×millimeters)/(square meters×day×atmosphere).

In some of these embodiments, the upstream layer has a water vapor transmission rate (WTVR) that is 0.6 or less, measured in (grams×millimeters)/(square meters×day).

In some of these embodiments, the upstream layer has a water vapor transmission rate (WTVR) that is 0.09 or less, measured in (grams×millimeters)/(square meters×day).

In some of these embodiments, the upstream layer includes aluminum, titanium, platinum, nickel, steel, silver, gold, stainless steel, aluminum silicon, molybdenum, tungsten, tungsten carbide, and/or or tantalum.

In some of these embodiments, the upstream layer is in contact with the downstream layer.

In some of these embodiments, the passivation region includes an intermediate layer between the upstream layer and the downstream layer.

In some of these embodiments, the passivation region has a thickness of 100 microns or less.

In some of these embodiments, the passivation region has a thickness of fifty microns or less.

In various embodiments, a neutron beam system includes an accelerator, and a beamline extending from the accelerator to a neutron generation target configured in accordance with any of the aforementioned embodiments.

It should be noted that all features, elements, components, functions, and steps described with respect to any embodiment provided herein are intended to be freely combinable and substitutable with those from any other embodiment. If a certain feature, element, component, function, or step is described with respect to only one embodiment, then it should be understood that that feature, element, component, function, or step can be used with every other embodiment described herein unless explicitly stated otherwise. This paragraph therefore serves as antecedent basis and written support for the introduction of claims, at any time, that combine features, elements, components, functions, and steps from different embodiments, or that substitute features, elements, components, functions, and steps from one embodiment with those of another, even if the following description does not explicitly state, in a particular instance, that such combinations or substitutions are possible. It is explicitly acknowledged that express recitation of every possible combination and substitution is overly burdensome, especially given that the permissibility of each and every such combination and substitution will be readily recognized by those of ordinary skill in the art.

As used herein and in the appended claims, the singular forms "a," "an," and "the" include plural referents unless the context clearly dictates otherwise.

While the embodiments are susceptible to various modifications and alternative forms, specific examples thereof have been shown in the drawings and are herein described in detail. It should be understood, however, that these embodiments are not to be limited to the particular form disclosed, but to the contrary, these embodiments are to cover all modifications, equivalents, and alternatives falling within the spirit of the disclosure. Furthermore, any features, functions, steps, or elements of the embodiments may be recited in or added to the claims, as well as negative limitations that define the inventive scope of the claims by features, functions, steps, or elements that are not within that scope.

What is claimed is:

1. A neutron generation generating target, comprising:
   a substrate;
   a neutron generation region positioned over the substrate; and
   a passivation region positioned over the neutron generation region, wherein the passivation region comprises a first layer and a second layer,
   wherein the neutron generation region comprises an objective material configured to generate neutrons, the first layer of the passivation region is configured to seal against diffusion of the objective material into the passivation region, and the first layer is between the second layer and the objective material, and wherein the first layer covers and extends beyond the objective material and the second layer covers and extends beyond the first layer.

2. The neutron generating target of claim 1, wherein the first layer of the passivation region has a coefficient of diffusion for the objective material of $1 \times 10^{-13}$ square centimeters per second ($cm^2/s$) or less.

3. The neutron generating target of claim 1, wherein the first layer of the passivation region has a coefficient of diffusion for the objective material that is $1 \times 10^{-14}$ $cm^2/s$ or less.

4. The neutron generating target of claim 1, wherein the first layer of the passivation region has a coefficient of diffusion for the objective material that is $1 \times 10^{-15}$ $cm^2/s$ or less.

5. The neutron generating target of claim 1, wherein the objective material is lithium, and wherein the first layer of the passivation region has a coefficient of diffusion for lithium that is $5 \times 10^{-14}$ $cm^2/s$ or less.

6. The neutron generating target of claim 1, wherein the objective material is lithium, and wherein the first layer of the passivation region has a coefficient of diffusion for lithium that is $5 \times 10^{-15}$ $cm^2/s$ or less.

7. The neutron generating target of claim 1, wherein the first layer of the passivation region comprises lithium fluoride.

8. The neutron generating target of claim 1, wherein one or more of the first layer of the passivation region comprises lithium fluoride, lithium sulfide, magnesium fluoride, carbon (C), diamond-like carbon, (ultra) nanocrystalline diamond, or a polymer.

9. The neutron generating target of claim 1, wherein one or more of the first layer the passivation region comprises lithium, and does not comprise lithium nitride, lithium oxide, nor lithium hydroxide.

10. The neutron generating target of claim 1, wherein the first layer of the passivation region is in contact with the objective material, and the first layer does not comprise aluminum nor beryllium.

11. The neutron generating target of claim 1, wherein the passivation region has a thickness of 10 microns or less.

12. The neutron generating target of claim 1, wherein the passivation region has a thickness of three microns or less.

13. The neutron generating target of claim 1, configured for use in a boron neutron capture therapy (BNCT) procedure.

14. The neutron generating target of claim 13, configured to generate neutrons when exposed to a proton beam having an energy between 1.88 and 3.0 mega-electron volts (MeV).

15. The neutron generating target of claim 1, wherein the first layer and the second layer of passivation region are configured to be removed during operation of a system within which the neutron generating target is placed, wherein the operation comprises application of a particle beam in a region of the neutron generating target.

16. The neutron generating target of claim 1, wherein the objective material comprises lithium.

17. The neutron generating target of claim 1, wherein the passivation region comprises molybdenum.

18. The neutron generating target of claim 1, wherein the passivation region comprises tungsten.

19. The neutron generating target of claim 1, wherein the objective material is lithium, the substrate is copper, and the lithium is in direct contact with the copper.

20. A neutron beam system, comprising:
    an accelerator;
    a beamline extending from the accelerator to a neutron generating target located downstream of the accelerator, wherein the accelerator is configured to accelerate a particle beam towards the neutron generating target, wherein the neutron generating target comprises:
    a substrate;
    a neutron generation region positioned over the substrate; and
    a passivation region positioned over the neutron generation region, wherein the passivation region comprises a downstream layer and an upstream layer,
    wherein the neutron generation region comprises an objective material configured to generate neutrons, the downstream layer of the passivation region is configured to seal against diffusion of the objective material into the passivation region, and the downstream layer is between the upstream layer and the objective material, and wherein the downstream layer covers and extends beyond the objective material and the upstream layer covers and extends beyond the downstream layer.

21. The neutron beam system of claim 20, wherein the objective material of the neutron generating target comprises lithium.

22. The neutron beam system of claim 20, wherein the downstream layer of the passivation region of the neutron generating target comprises lithium fluoride, lithium sulfide, magnesium fluoride, carbon (C), diamond-like carbon, (ultra) nanocrystalline diamond, or a polymer.

23. The neutron beam system of claim 20, wherein the objective material is lithium, the substrate is copper, and the lithium is in direct contact with the copper.

* * * * *